United States Patent [19]

Chauvel

[11] Patent Number: 5,128,760
[45] Date of Patent: Jul. 7, 1992

[54] TELEVISION SCAN RATE CONVERTER

[75] Inventor: Gerard Chauvel, Antibes, France

[73] Assignee: Texas Instruments Incorporated, Dallas, Tex.

[21] Appl. No.: 559,758

[22] Filed: Jul. 30, 1990

[30] Foreign Application Priority Data

Feb. 28, 1990 [EP] European Pat. Off. ............ 90400560

[51] Int. Cl.$^5$ .................. H04N 7/01; H04N 7/18; H04N 11/20
[52] U.S. Cl. .................. 358/140; 358/105; 358/11
[58] Field of Search ............ 358/105, 140, 11, 213.22, 358/160; 382/42, 41

[56] References Cited

U.S. PATENT DOCUMENTS

| | | | |
|---|---|---|---|
| 4,786,820 | 11/1988 | Ogino et al. | 358/213.22 |
| 4,791,677 | 12/1988 | Mori et al. | 358/41 |
| 4,939,575 | 7/1990 | Childers | 358/160 |

*Primary Examiner*—John K. Peng
*Attorney, Agent, or Firm*—Robby T. Holland; René E. Grossman; Richard L. Donaldson

[57] ABSTRACT

A single-instruction multiple-data processor (10) has an input layer especially designed for high data input and output rates. The processor (10) has a number of processing elements (20), each corresponding to incoming data samples. The processing elements (20) are interleaved so that a set of samples can be input in parallel. This configuration is especially useful for scan rate conversion, where the data output rate may not necessarily be the same as the data input rate.

15 Claims, 20 Drawing Sheets

TELEVISION SCAN RATE CONVERTER

RELATED APPLICATIONS

This application is related to U.S. patent applications Ser. No. 119,890, filed Nov. 13, 1987; Ser. No. 435,862 (TI-13116A), filed Nov. 13, 1989; Ser. No. 119,889 filed Nov. 13, 1987; Ser. No. 256,150, filed Nov. 13, 1987; Ser. No. 323,045 filed Mar. 10, 1989, and U.S. Pat. No. 4,939,575. These foregoing applications have a corresponding European Patent Application No. 0 317 218, filed Nov. 11, 1988.

This application is also related to U.S. Ser. No. 421,499, which was filed in the United States on Oct. 13, 1989, and to copending applications U.S. Ser. No. 574,410 filed Aug. 28, 1990 and No. 559,469 filed July 30, 1990, which were previously filed as one corresponding European Patent Application No. 90400560.0, filed Feb. 28, 1990, E.P.O.. These applications are assigned to Applicant's assignee and the contents of these applications are hereby incorporated herein by reference.

TECHNICAL FIELD OF THE INVENTION

This invention generally relates to single instruction, multiple data processors, and more particularly to such a processor that is programmable and achieves a high processing throughput speed.

BACKGROUND OF THE INVENTION

Single-instruction multiple-data (SIMD) processors are characterized by having an array of processors that perform the same operation simultaneously on every element of a data array. Vector processing, an application of SIMD processors, uses vector instructions, which specify the operation to be performed and specify the list of operands, i.e., the data vector, on which it will operate.

The use of processor arrays and vector processing can result in extensive parallelism, resulting in high execution speeds. Yet, despite impressive execution speeds, getting data in and out of the processor can be a problem. Execution speeds are less useful if input/output speeds cannot keep up.

In many applications, such as video processing, real-time processing speed is desirable. Yet, a stumbling block to real-time processing is the large amount of data that must be processed to generate the pixels, lines, and frames of a video picture.

A need exists for an easily manufactured SIMD processor that maximizes data input rates without increasing manufacturing costs. Although the need for such processors is not limited to television, digital television processing involves processing tasks, such as scan rate conversion, for which a processor with a fast throughput is desirable.

With regard to scan rate conversion, television relies on the concept that a picture can be broken down into a mosaic suitable for transmitting and then reassembled to produce a television picture. This process is accomplished with linear scanning. The television picture is scanned in a sequential series of horizontal lines, at both the transmitting and receiving end of the television system.

Various geopolitical regions have different scanning standards. The United States uses the National Television Systems Committee (NTSC) standard. Each picture, i.e., frame, has 525 lines. These lines are interlaced to make two fields having 262.5 lines each, and each field is scanned at a rate of 60 fields per second. Some countries use a Phase Alternate Line (PAL) system, which has similar characteristics. Other countries use a Sequential Color and Memory (SECAM) system, in which 625 lines make up a frame. The lines are interlaced to make two fields having 312.5 lines each, and each field is scanned at a rate of 50 fields per second.

If a scan rate is too slow, the viewer will notice a large area flicker. The 60 Hz and 50 Hz standard scan rates are intended to exceed a rate at which flicker is annoyingly noticeable, but not place expensive technological demands on the receiving system. Nevertheless, faster scan rates are desirable for improved viewing.

In addition to scan rates, another factor in picture quality is the number of lines per frame, i.e., vertical resolution. If there are too few lines, the distinction between each line is perceptible. Like scan rate standards, the selection of a standard number of lines per field is intended to surpass the viewer's annoyance level without unduly burdensome technological costs. Yet, like faster scan rates, higher line per field ratios are desirable for improved viewing.

Recent developments in television systems include digital processing within the receiver to convert scan characteristics, such as scan rates and lines per field. Yet, existing digital receivers process data serially, and because of processing throughput limitations of serial systems, the pixel resolution is limited. A need exists for a television receiving system that receives an incoming signal with one set of scan characteristics and generates a picture with different scan characteristics. The processing throughput should not unduly constrain the level of pixel resolution.

SUMMARY OF THE INVENTION

One device described herein is a digital processing system, used in a television receiver, for converting the scan characteristics of an incoming television signal. The system has a pair of luminance field memories, one for odd fields and one for even fields, for storing data samples of said incoming signal, and has a pair of chrominance field memories, one for odd fields and one for even fields, for storing data samples of said incoming signal. A pair of luminance single-instruction multiple-data processors implement a vertical filter process for changing the number of lines per field of said signal, such that one of said processors is in communication with the luminance field memory containing odd fields and operates on samples of said odd fields and one of the processors is in communication with the luminance field memory containing even fields and operates on samples of said even fields. A pair of chrominance single-instruction multiple-data processors has a similar configuration and operation. Each processor is associated with an instruction generator and is programmed to carry out vertical filtering operations to change the number of lines per field. A processor control unit provides control and timing signals.

A technical advantage of the scan converter unit is that the same processor may be used to improve the vertical resolution of an incoming television signal, as well as to provide a different scan rate.

DETAILED DESCRIPTION OF THE INVENTION

Serial Video Processor

Figure 1:
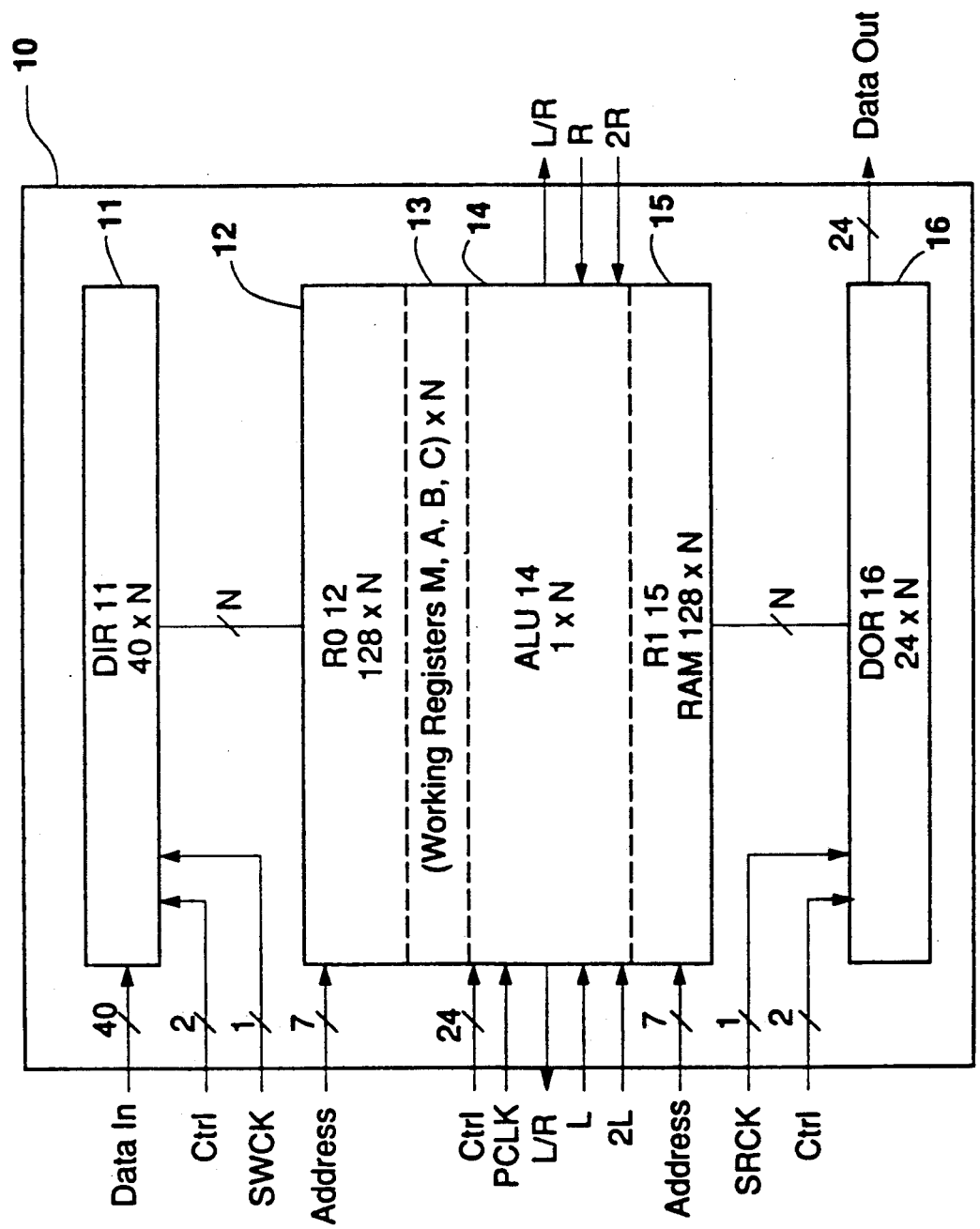
FIG. 1 is a block diagram of a representative singleinstruction multiple-data processor.

FIG. 1 illustrates an example of a serial video processor (SVP) 10, which may also be described as a synchronous vector processor (also SVP). The SVP 10 of FIG. 1 is the subject of the copending patent applications cited above. Subsequent sections of this application are directed to devices and processes that use SVP 10. However, these devices and processes are not necessarily limited to use with this particular SVP 10, and variations of SVP 10 may be used.

The "serial video" aspects of SVP 10 derive from the fact that it is particularly suited for video processing, where discrete packets of incoming data, which have a uniform size, are input and output in a word-serial manner but are processed in parallel. The "synchronous vector" aspects of SVP 10 derive from the fact that it receives and processes data vectors in synchronization with a real time data source. Essentially, SVP 10 operates by using fine-grained parallelism techniques in which many processing elements operate on the data concurrently.

SVP 10 is a general purpose, mask-programmable, single-instruction multiple data (SIMD), reduced instruction set computing (RISC) device. Consistent with the SIMD characteristic, SVP 10 has a number of processing elements (PE's), which execute the same instruction at the same time. External microinstructions control primitive logic and arithmetic functions for each clock cycle.

Figure 2:
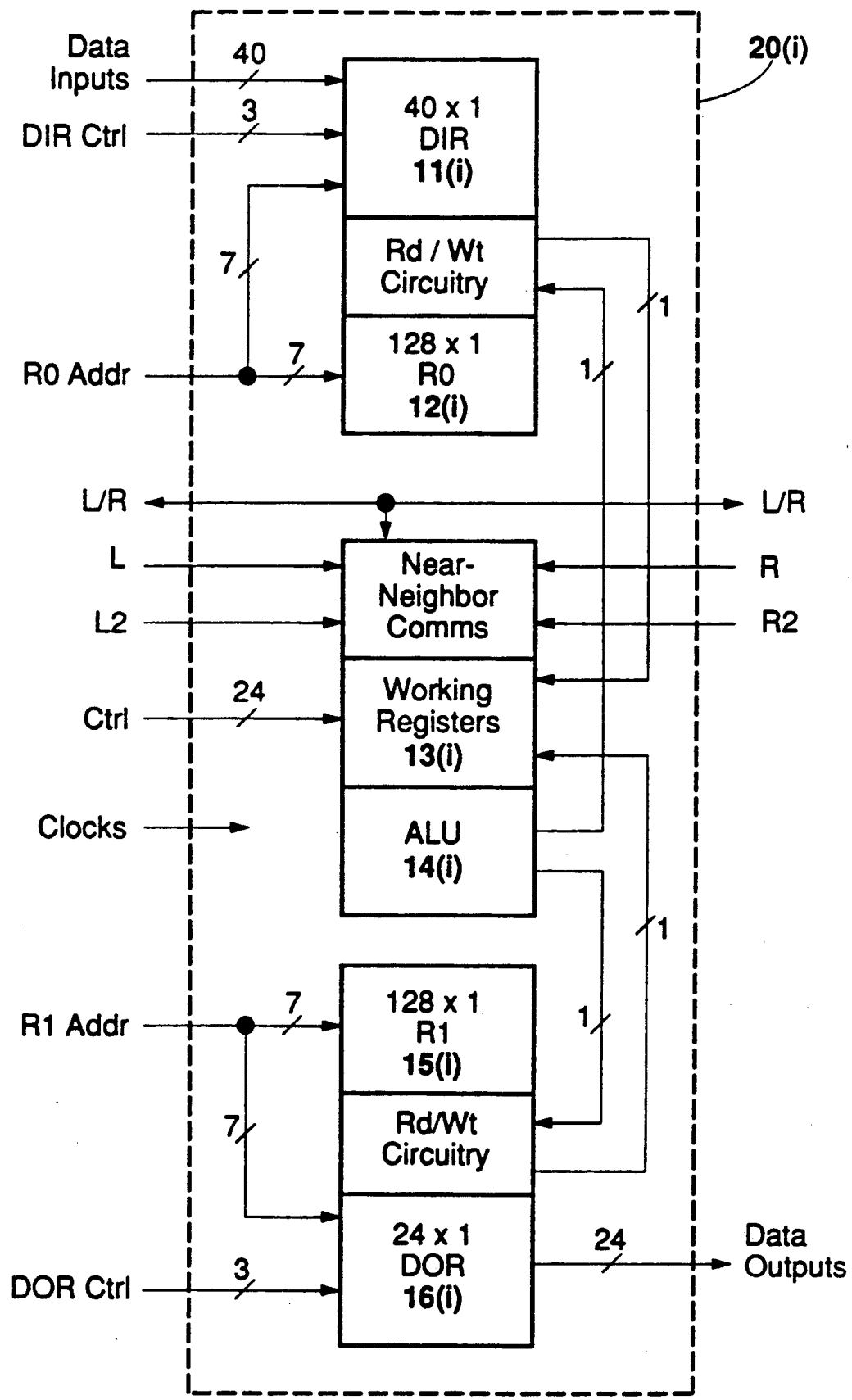
FIG. 2 is a block diagram of a processing element of the processor of FIG. 1.

Referring to FIGS. 1 and 2, SVP 10 is a one-dimensional array of one-bit PE's 20. Each PE 20 has the following basic components: a data input register (DIR) 11, two independently addressed register files (R0 and R1) 12 and 15, a set of working registers (WR's) 13, a one bit arithmetic unit (ALU) 14, and a data output register (DOR) 16. These are described briefly in this section, and reference to the related patents cited above will provide further description, especially with regard to instructions and timing.

DIR 11 can be thought of as the "input layer". R0 12 and R1 15, the WR's 13, and the ALU 14 are the "computational layer". DOR 16 is the "output layer". Although each layer may be independently clocked across each layer, all PE's 20 operate in unison, every clock cycle. The input to DIR 11 is word-serial in the sense that words of an incoming packet of data are received into DIR 11 word by word. Similarly, the output from DIR 16 is word-serial.

Although input and output are word-serial, processing of each data packet is parallel. Also, because of the "layered" approach to processing, data input, computation, and data output may be concurrent operations, with each being independently clocked. Each PE 20 performs these operations on an entire vector of data at once, and is thus a "pipeline" that enables several operations to be in various stages at once. When a vector instruction is executed, the elements of the vector are fed into the appropriate pipeline one at a time, delayed by the time it takes to complete one stage of the pipeline. Input and output are in synchronization with the data source, such as a video camera, and with the data sink, such as a raster scan display.

For purposes of illustration, SVP 10 has N number of PE's 20, where N = 1440. The memory size is 256 bits for each PE 20, with 128 bits each for R0 and R1, DIR 11 is 40 bits wide and DOR 16 is 24 bits wide. These sizes are discretionary, however, and may be changed without changing the substance of the invention. The input and output bit sizes are included in FIGS. 1 and 2 to illustrate various input/output and device size relationships. However, these bit sizes may be varied according to the application.

Using these values, a single SVP 10 can process data packets of 1 to 1440 words by 40 bits. Typically, the packets are equal in size and represent periodically recurring data, such as lines of a television image, where each packet is digitized into N number of data samples, and where each sample, S(i), i = 1...N, is a data word used to generate an output word. In television applications, where SVP 10 has N PE's 20, N also represents the number of data samples per line.

FIG. 2 illustrates a single PE 20(i) and its associated components, where i = 1...1440. A vertical slice through SVP 10 of FIG. 1 yields an individual PE 20 of FIG. 2, thus each PE 20(i) and its components are referred to herein as a "column" with respect to the entire array of SVP 10.

DIR 11 and DOR 16 are the basic I/O devices of SVP 10. Both DIR 11 and DOR 16 are arrays of sequentially addressed, dual-ported memory cells. As used in this description, "DIR 11" refers to the entire array, and "DIR 11(i)" refers to the column of DIR 11 that receives data sample S(i).

Referring to both FIGS. 1 and 2, the input array size to SVP 10 permitted by DIR 11 is 1440 words × 40 bits. One port of DIR 11 is organized as 1440 words of 40 bits each and permits DIR 11 to be written into from a 40 bit input line in parallel. Thus, this first port of DIR 11 emulates the write port of a 1440-word line memory, which permits word-serial input. The second port of DIR 11 is organized as 40 words of 1440 bits each, where each bit corresponds to a PE 20(i). This second port provides an interface between DIR 11 and PE's 20. It is physically a part of, and is mapped into, the absolute address space of R0 12. This permits the contents of DIR 11 to be addressed for selection to write into memory and is read in parallel.

Like DIR 11, DOR 16 is a two port device. In a manner similar to DIR 11, it provides 1-bit access to each ALU 14(i) and 24-bit output from SVP 10. One port of DOR 16 is organized as 1440 words of 24 bits each. This port functionally emulates the read port of a 1440-word line memory and is used for word-serial output. The second port of DOR 16 is organized as 24 words of 1440 bits each, where each bit corresponds to a PE(i). This second port couples to R1 15, and is written to in parallel.

The write and read control signals to DIR 11 and from DOR 16 are explained in detail in subsequent sections of this application, but in general, DIR 11 and DOR 16 each have a 1440-bit word selection commutator, which controls loading to and reading from DIR 11 and DOR 16, respectively. Also, DIR 11 and DOR 16 each have an enable and a reset signal.

The data inputs to DIR 11 are controlled by the signals Write Enable (WE), Reset Write (RSTW), and Serial Write Clock (SWCK). WE controls both the write function and the address pointer increment function synchronously with SWCK, which is the data sample clock input. When high, RSTW resets the address pointer to the first word in DIR 11 on the next rising edge of SWCK. The control signals for DOR 16 are Read Enable (RE), Reset Read (RSTR), and Serial Read Clock (SRCK), which operate in an analogous manner.

R0 12 and R1 15 each have 128 words by 1 bit of read/write memory per PE 20. Different addressing structures cover the R0 12 and R1 15. However, R0 12 and R1 15 share the same control and timing circuitry. R0 12 and R1 15 are comprised of random access memory (RAM) cells. If dynamic RAM cells are used, they must be refreshed, but typical digital television applications perform the refresh by operating in a faster cycle time than the required refresh period.

Each R0 12(i) and R1 15(i) is independently addressable, and is capable of 1-bit read-modify-write cycle such that it can be read, the data operated on by ALU 14, and the result written back to it in a single clock cycle. R0 12 and R1 15 read data at the same time, but write separately.

The working register (WR) set 13(i) for each PE 20(i) comprises four registers: M, A, B, and C. These registers are the same, except for their data sources and destinations. Each WR 13(i) is associated with an input multiplexer for providing data to the four inputs of each ALU 14(i). The M register is used for division, multiplication, and logical and conditional operations. Registers A, B, and C are addend, minuend, and carry/borrow registers, respectively.

ALU 14 is a simple full adder/subtracter and a one-bit multiplier. The inputs to ALU 14 are from the WR's 13. These ALUs carry out whatever instruction is specified by the control unit of SVP 10. A feature of SVP 10 is that each ALU 14 executes instructions from a set of instructions that operate on data directly. A control unit, which feeds an instruction stream to SVP 10 has an additional set of instructions that provide basic execution control. The control unit is further described below in connection with FIG. 5.

Figure 3:
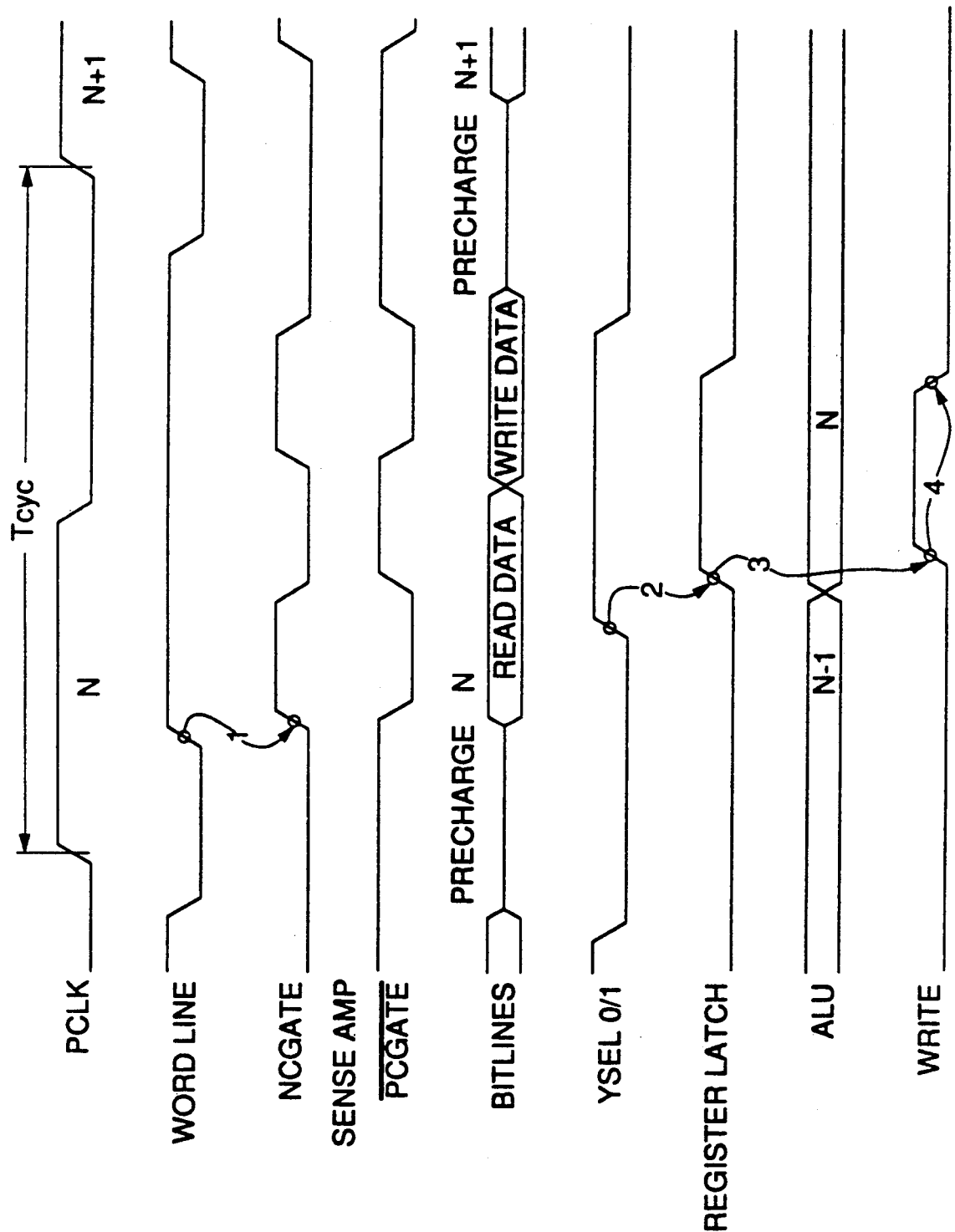
FIG. 3 is a timing diagram of the processor of FIG. 1.

FIG. 3 is a timing diagram of a single cycle of SVP 10. A processing clock (PCLK) is one of three clocks of SVP 10, where each clock corresponds to an input, computational, or output layer. Although the clocks are asynchronous to permit concurrent operations of these three layers, the input and output clocks stop to permit data transfers into and out of the computational layer.

In FIG. 3, one PCLK cycle, N, has a period T. The labeled timing points indicate interlocked edges, where NCGATE and PCGATE are control signals for sense amplifiers (not shown) and YSEL 0/1 indicates a select signal for R0 12 or R1 15. The sense amplifiers amplify and control the BITLINES for R0 12 and R1 15 transfers. To achieve single-cycle, 1440-bit, parallel computations, data transfers between R0 12, R1 15, and ALU 14 are precisely timed. Each such data transfer is held off by a computation interlock circuit until the end of computation is indicated. This technique achieves a fast memory/processor data transfer rate.

Figure 4:
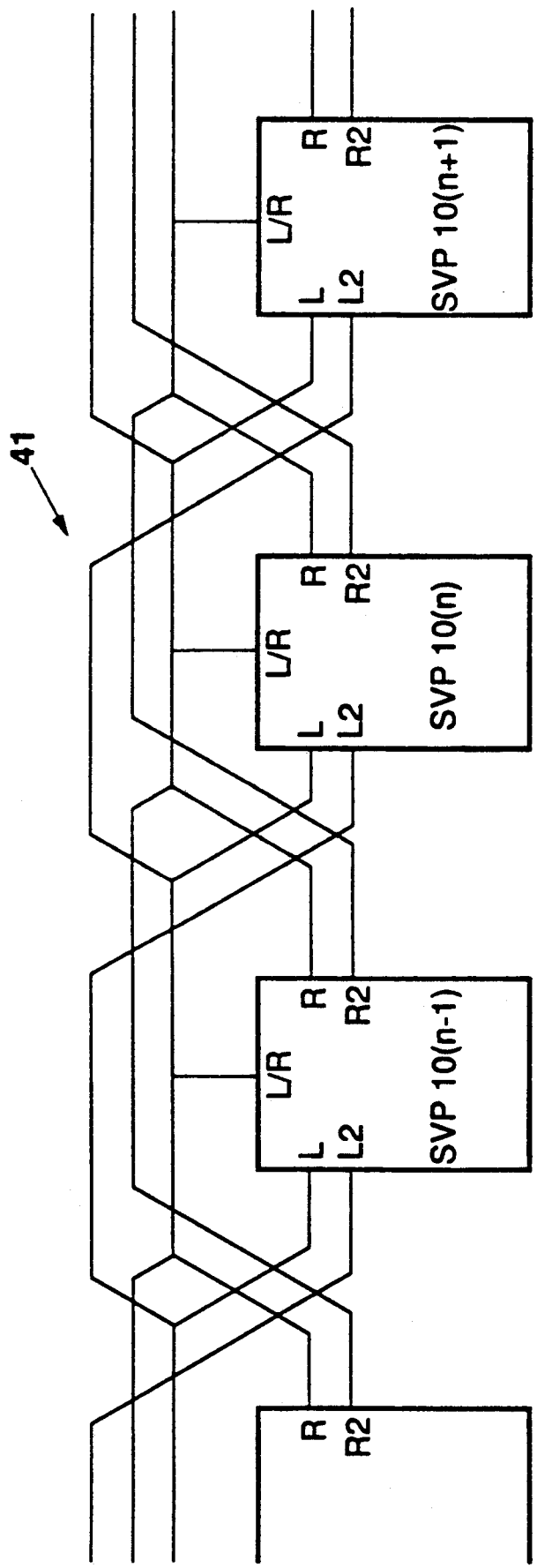
FIG. 4 illustrates near-neighbor communications among processing elements of the processor of FIG. 1.

FIG. 4 illustrates the near neighbor communications among PE's 20. A left/right (L/R) bus 41 provides direct memory and register read/write from each PE 20 to its four nearest neighbor PE's 20, i.e., the two PE's 20 to the left and the two PE's 20 to the right. To accomplish such communication, each PE 20 generates one output, which is fanned out to its four neighbor PE's 20. This output may be from any one of four sources: a logical 0, the contents of the B register of WR 13, or a location from either R0 12 or R1 15. Each PE 20 also receives four signals, one from each of its four nearest neighbors.

As will be explained below, many digital signal processing tasks involve the use of filter algorithms to remove unwanted signal artifacts. The L/R communications of FIG. 4 are especially useful for multi-tap FIR filters, which can be factored into five or fewer taps.

SVP Video Applications

As indicated above, SVP 10 is especially useful for digital video processing. Each signal segment that represents a horizontal line of an 4 incoming television signal is digitized as a data "packet" comprised of a data samples. SVP 10 loads, processes, and outputs data for each pixel on a horizontal line in parallel. The architecture of SVP 10 permits data vectors from multiple pixels, multiple lines, or multiple fields to be processed in parallel, and hence SVP 10 is capable of the "three dimensional processing" required for digital television.

A particular advantage of using SVP's 10 is that discrete line memories are not required. Line-by-line storage is emulated in the processing of SVP 10, using a software procedure, referred to as "global rotation". This procedure is explained in the above-cited U.S.

patent application, Ser. No. 421,499 and in connection with FIG. 13 below.

Figure 5A:
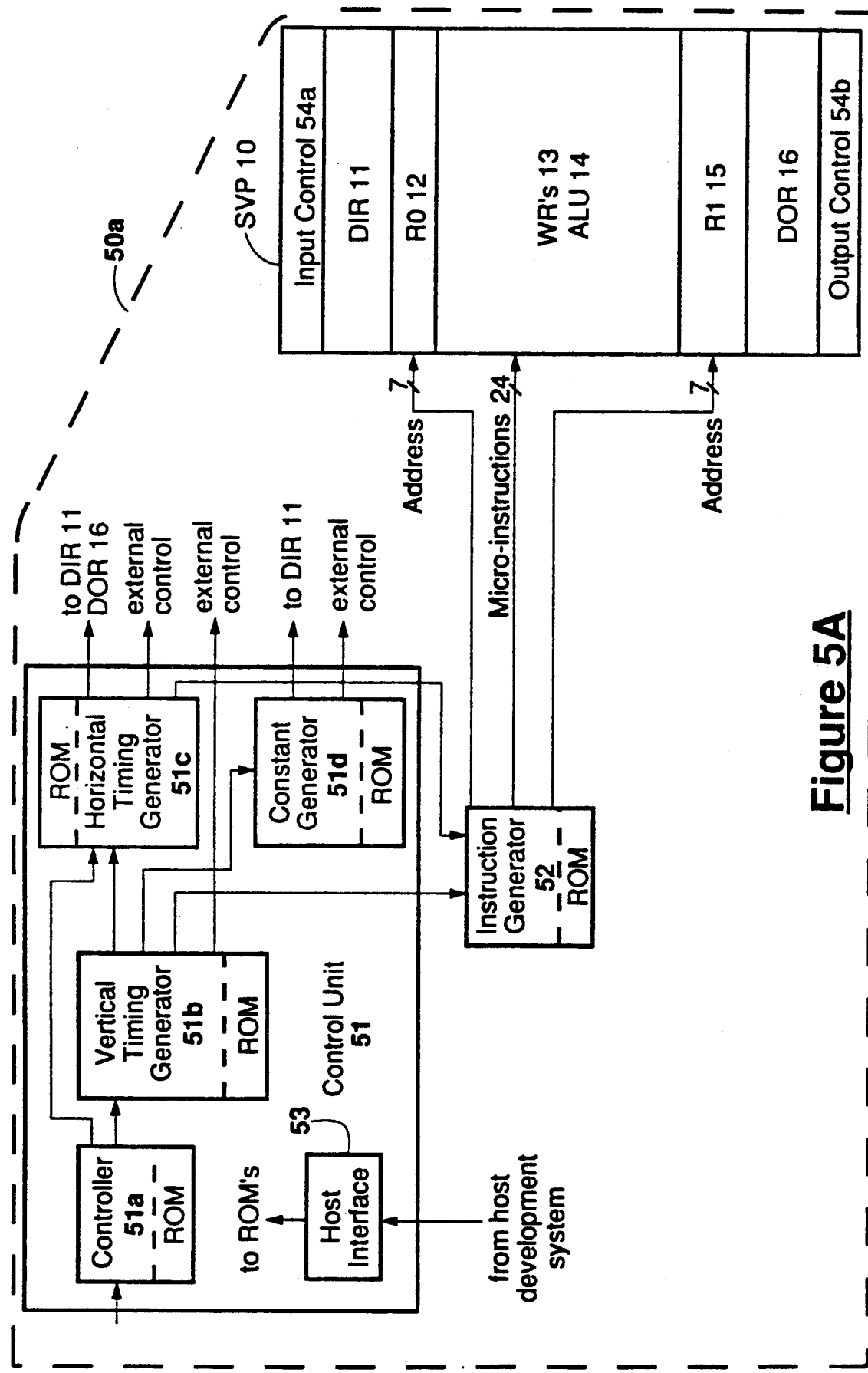
FIG. 5A is a block diagram of a digital processing unit that includes the processor of FIG. 1.

FIG. 5A illustrates a basic processor system 50a having a single SVP 10. The television receiver circuitry surrounding processor system 50a is described in connection with FIG. 5B, which also illustrates data inputs to SVP 10. In contrast, FIG. 5A illustrates the control, address, and instruction inputs to SVP 10, and may be supplemented with the description of the same circuits in the above-cited U.S. patent application, Ser. No. 421,499.

Referring now to FIG. 5A, the basic components of processor system 50a are SVP 10, an SVP control unit 51, and an instruction generator 52. The use of one SVP 10 versus more than one SVP 10 is dependent on the complexity of the processing tasks and hence on the execution time. For fullscreen real-time video processing, the operations performed on a line of picture data must be executed in a single 1H period, where H represents the period of one horizontal scan line. However, if 1H is not enough time, more than one SVP 10 may be interconnected and processing tasks partitioned among them.

Each SVP 10 need not have the exact configuration of FIGS. 1 and 2. As already stated, the distinguishing characteristics of an SVP 10 is the ability to process a data packet representing a data packet consisting of an entire line of a television picture in parallel, using a processing element for each pixel.

An input control unit 54a, may perform more than one type of input control, depending on the types of tasks to be performed. For loading DIR control circuit 10a includes a means for controlling the WE signal, which is triggered to begin at the end of a horizontal blanking period and clocked so that all columns of DIR 11 are loaded during one horizontal scan period. Input control unit 54a also controls what type of data is received into SVP 10. A particular type of input control circuit, especially designed for high data input rate, is described in the next section of this application. An output control unit 54b may be configured using similar techniques.

SVP control unit 51 has several components: controller 51a, vertical timing generator 51b, horizontal timing generator 51c, and constant generator 51d. Ideally, each of these devices is programmable and accesses its own program store memory. In FIG. 5A, each of these components has its own read only memory (ROM). To facilitate development of processing tasks, programs may be developed on a host system (not shown) and downloaded to each ROM, using standard interface techniques. A host interface 53 may be for either parallel or serial data transfers, for example an RS-232C interface.

In operation, SVP control unit 51 generates control signals for SVP 10, which are synchronized with the vertical synchronization signal and the horizontal synchronization signal of the incoming television transmission. These control signals include operating constants, instructions, and timing signals. As an overview of the timing operation of SVP control unit 51, controller 51a controls the video signal processing at a field or frame rate, vertical timing generator 51b controls processing at a line rate, and horizontal timing generator 51c controls processing at a pixel rate.

SVP control unit 51 also provides timing and control signals to other system components, such as for horizontal and vertical synchronization. These latter timing signals are "external" in the sense that they do not control processor system 50a. Instead they control devices such as field memories, as described in subsequent sections of this Controller 51a receives and interprets external commands from a main television receiver control unit (shown in FIG. 5B). It generates a series of control codes to vertical timing generator 51b and horizontal timing generator 51c. Controller 51a is programmable with a variety of instructions, including conditional and vectored jumps.

Vertical timing generator 51b provides control codes to horizontal timing generator 51c, constant generator 51d, and instruction generator 52. It provides timing to external circuits requiring a timing resolution of one horizontal line.

Figure 5B:
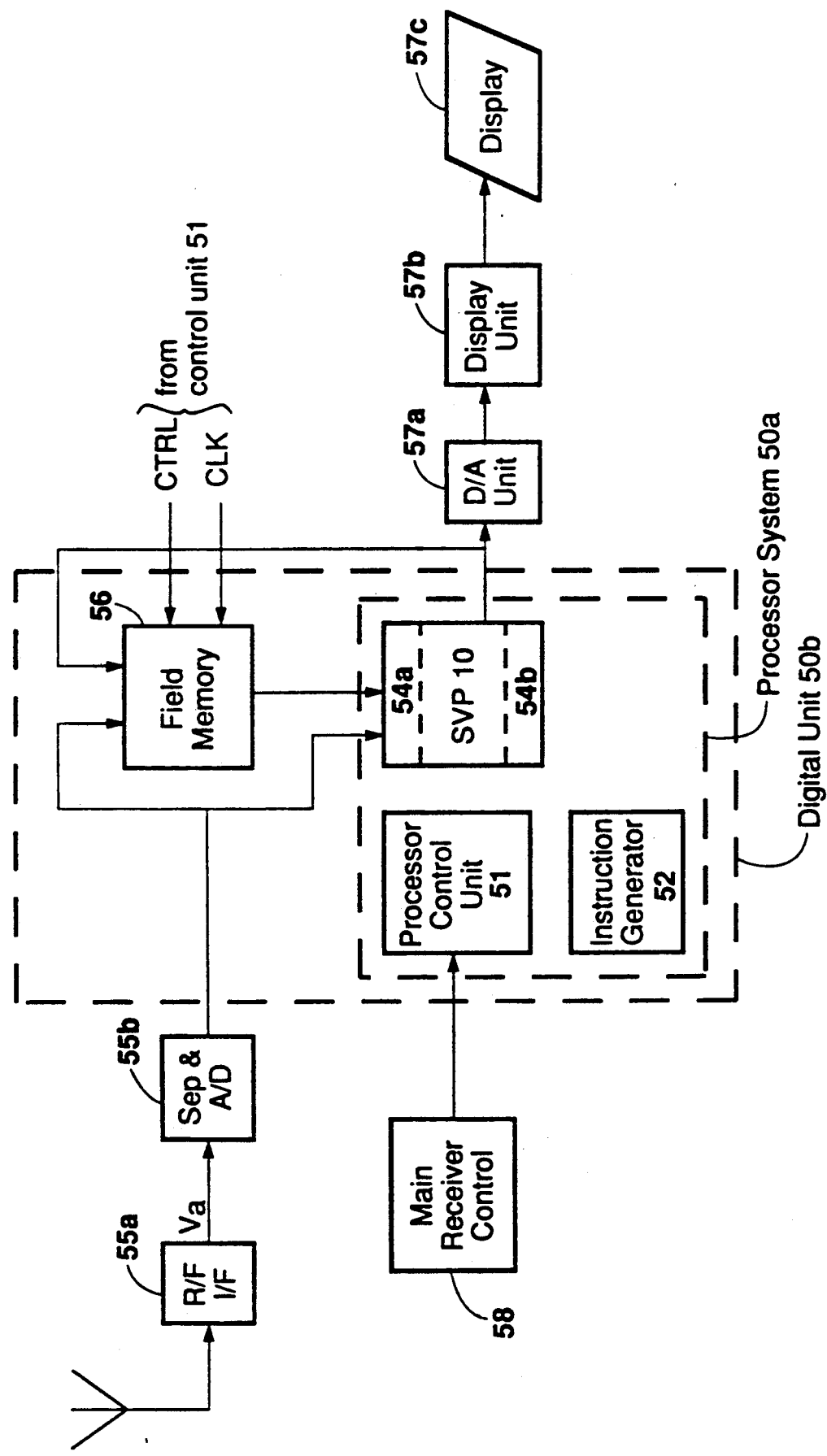
FIG. 5B is a block diagram of a typical television receiving system that includes the digital processing unit of FIG. 5A.

Horizontal timing generator 51c generates timing signals for circuits requiring timing edges at sample clock rates, such as DIR 11, DOR 16, field memories, and A/D and D/A converters (shown in FIG. 5B). It is capable of producing timing edges with a resolution as small as one sample clock.

Similarly, constant generator 51d provides constant values to individual PE's 20. There are two main reasons for using such constants. First, it is possible to map waveforms onto the PE's 20. Second, local constants distinguish the I chrominance signal from the Q signal, and permit the PE's 20 to multiplex and demultiplex the chrominance signal and to modify algorithms in the horizontal direction when merging two images.

Instruction generator 52 receives algorithm specifier codes from vertical timing generator 51b and condition flags from horizontal timing generator 51c. It outputs microinstructions to ALU 14, and addresses for R0 12 and R1 15. Also, instruction generator 52 provides basic execution control instructions, such as for jumps, calls and returns, test flags, and global rotation. Instruction generator 52 is associated with program storage, such as a ROM, to which instructions may be downloaded from a host system (not shown). The various digital television processing tasks performed by processor system 50a may include scan conversion, motion detection, luminance and chrominance signal processing, and interpolation and decimation. Many of these tasks involve the use of filter algorithms to remove unwanted signal artifacts. Special configurations and programming for scan conversion and filtering are explained in subsequent sections of this application.

FIG. 5B is a block diagram of the basic components of a television receiving system, which includes processor system 50a. More specifically, processor system 50a is part of a digital unit 50b, which also includes field memory 56. For purposes of providing a general idea of a receiver that is not specific to composite or component television systems, FIG. 5B does not differentiate between composite and component processing, which are two well known alternate approaches to digital television receivers systems. Instead, FIG. 5B simply indicates that the signals are digitized and separated before input into digital unit 50b.

At the front end of the system, a video signal from an antenna or other source is detected in the usual manner through standard RF/IF unit 55a, producing an analog video signal Va.

Separation and analog to digital (A/D) unit 55b performs whatever demodulation or separation is required for the particular signal being used and converts the signal to digital sample data. This data, in digital form, is referred to herein as the "signal" due to the fact that it represents a continuous incoming picture signal. Although word sizes and sampling rates may vary, for purposes of example herein, the sampling frequency is 4 fsc for luminance signals and 1 fsc for chrominance signals, where fsc is the color subcarrier frequency.

For every pixel to be displayed, this conversion produces three parallel inputs to DIR 11 of SVP 10, i.e., a luminance sample and two chrominance samples. With a 40-bit DIR 11, each pixel value may be represented by a total of 40 bits. Typically, each sample is an 8-bit word, thus each pixel is derived from at least three 8-bit words.

Digital unit 50b has a processor system 50a and field memory 56. Field memory 56 is simply a standard first in, first out memory for storing fields of video data. Field memory 56 is actually comprised of a number of field memories 56(i), which provide digital unit 50b with the field-delayed data used for various processing tasks, especially temporal filtering. Each of these field memories 6(i) may be any one of a number of well known storage devices, such as the TMS4C1060, manufactured by Texas Instruments, Inc. Field memory 56 may be a bank of DRAM's, or because random access is not necessary, may merely provide serial input and output. Depending on the algorithms performed by ALU 14, field memory 56 may be part of a feedback path to SVP 10, or it may simply provide pre-processing or post-processing storage.

A main receiver control unit 58 receives external signals, such as those from a key pad, remote control, or video decoder. It decodes these signals and transmits them to other receiver components, such as SVP control unit 51.

From digital unit 50b, the processed video data signal is output in parallel, as 8-bit words to D/A unit 57a. The resulting signals from D/A unit 57a are the same analog signals that would be received by display unit 57b if processor system 50 were not included. Thus, digital unit 50b is simply interposed in the signal path at the output of a convention television receiver RF/IF unit 55a.

Display unit 57b is a standard unit for converting the processed signals into red, green, and blue signals. This is accomplished by the usual matrix techniques.

Display 57c receives the analog video signal from display unit 57. Typically, display 57c is of a raster scan type, such as a cathode ray tube. However, the invention could be used with any type of display having appropriate adapter circuits to use the signal generated by SVP 10. For example, display 57c could be used with a display memory (not shown) that receives the signal from processor system 50a and outputs all pixel elements in parallel.

Data Input System

Figure 6:
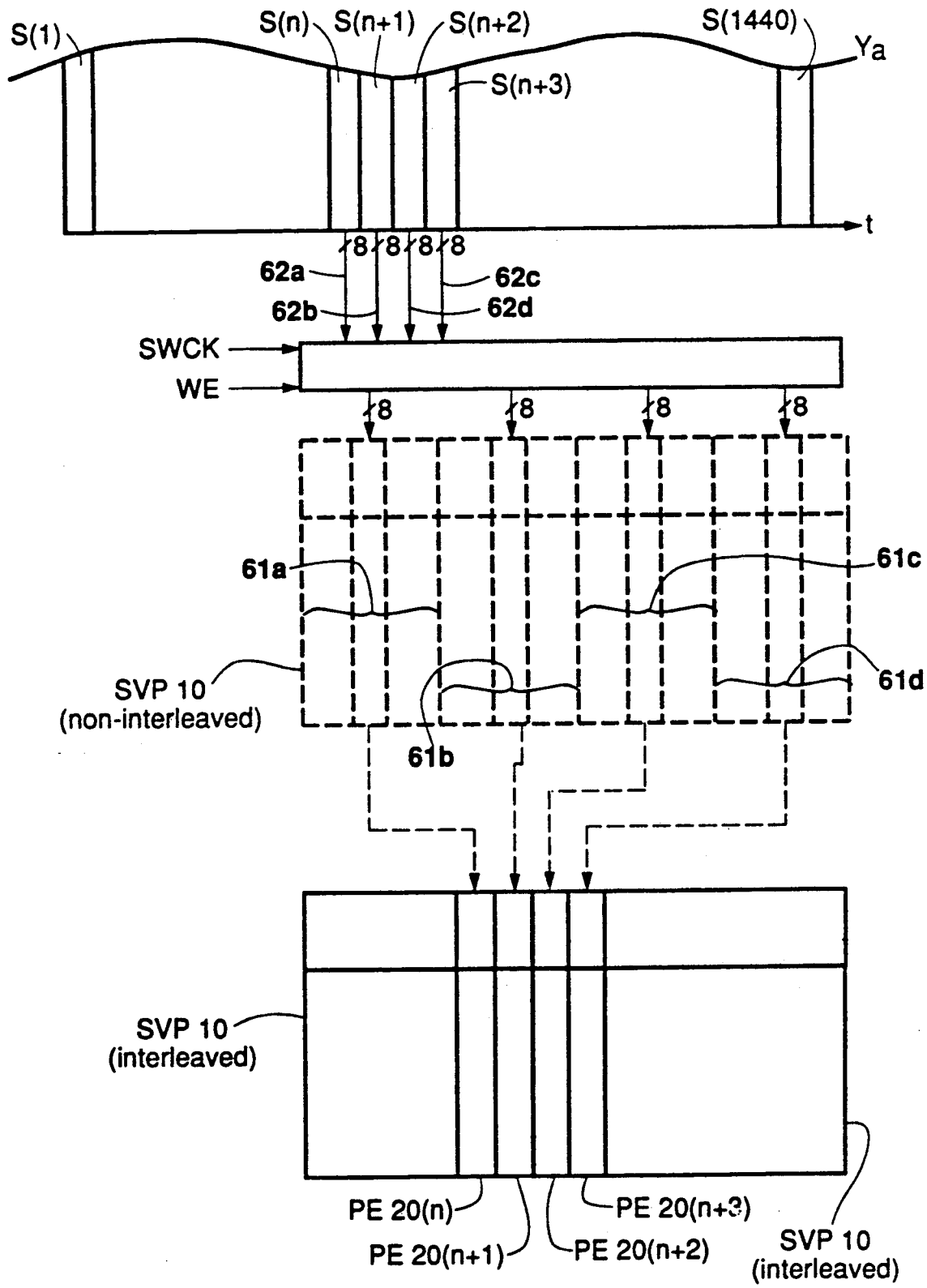
FIG. 6 illustrates the process of transferring data samples of an incoming signal to a blocked input register of a single instruction multiple data processor.
Figure 7:
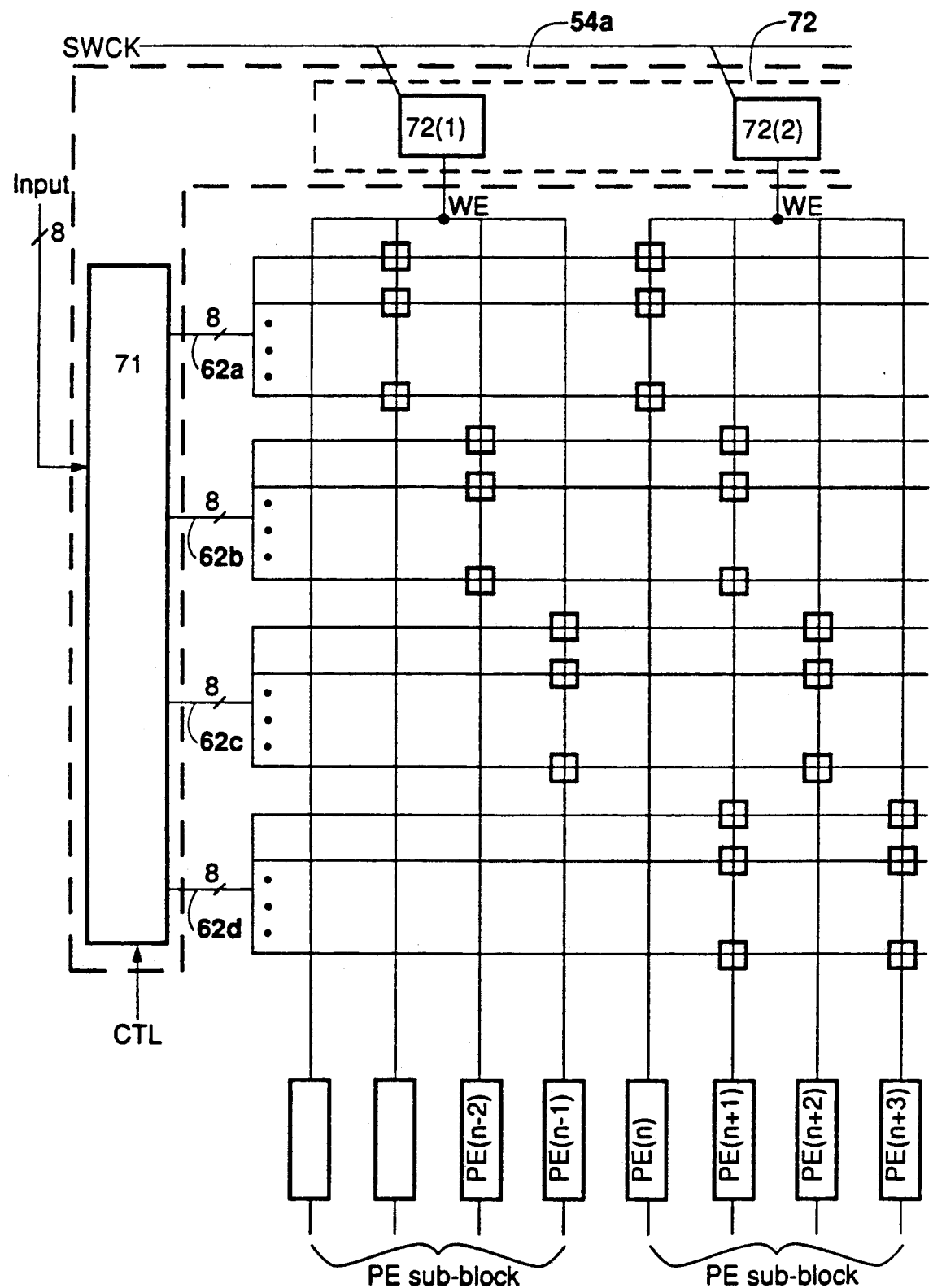
FIG. 7 illustrates the control circuit used in the process of FIG. 6.
Figure 8:
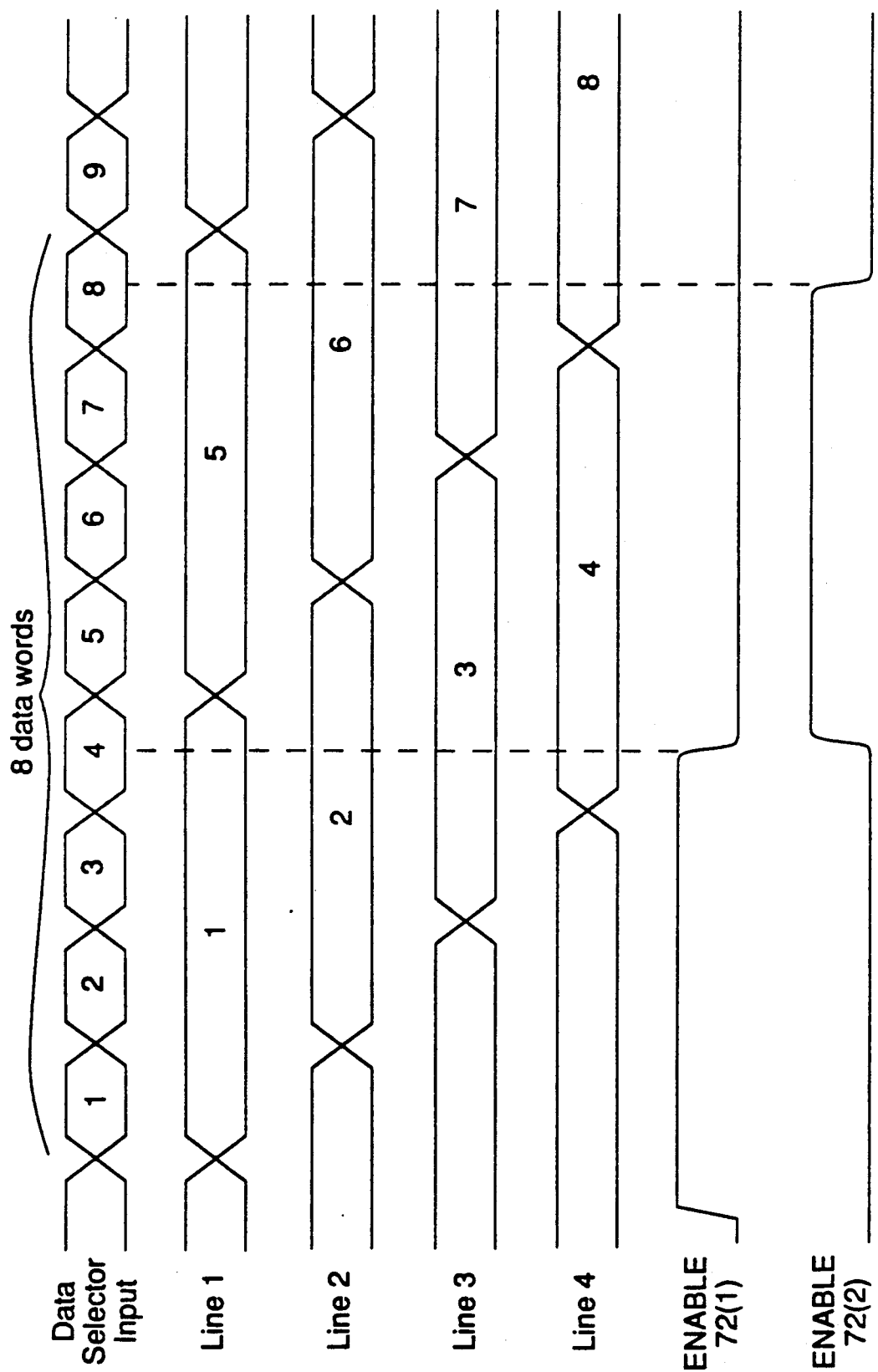
FIG. 8 is a timing diagram of the process of FIG. 6.

FIGS. 6-8 and the explanation in this section are directed to interleaving a single-instruction multiple-data processor to increase its data input rate. For purposes of explanation, the input data is a digitized television signal. However, the device and process described herein are not limited to television signals, and any series of data words may be substituted for the television signal.

FIG. 6 illustrates how a single-instruction multiple-data processor, such as SVP 10 of FIGS. 1 and 2, is configured to receive a television signal in this interleaved manner. SVP 10 is shown in relation to a luminance signal, Ya, which as stated above, is sampled at a regular sampling rate to produce data samples, S(n). Although FIG. 6 shows only luminance processing, the chrominance signal is handled in a similar manner.

Although FIG. 6 does not explicitly show signal separation and digitization, implicit in FIG. 6 is the sampling of signal Ya into data samples, each sample comprising an n-bit word. In the example of FIG. 6, each sample is 8 bits. Also not shown, but implicit in FIG. 6, is a data buffer or some other temporary storage of the incoming signal.

For purposes of receiving input control signals, SVP 10 is divided into four blocks 61a-61d, each having an equal number of PE's 20. The division of SVP 10 into four blocks rather than some other number of blocks is for purposes of example, and the number of blocks may be varied for different applications. FIG. 6 illustrates these blocks with both a non-interlaced and an interlaced representation.

Each block has S/n PE's 20, where S is the number of data samples per packet and n is the number of blocks. For example, if a luminance signal has 1440 data samples per line, SVP 10 might have four blocks, each block having 360 PE's 20.

During a single SWCK period, four data words from four input channels 62a-62d are written to DIR 11 in parallel. Each block 61a-61d receives one word. During a first time interval, sample, S(n) is received into block 61a, sample S(n+1) into block 61b, sample S(n+2) into block 61c, and sample S(n+3) into block 61d. During a next time interval, the next sample would be received into block 61a, and so on. Thus, for each time interval, DIR 11 receives four words rather than one.

As indicated in the interleaved representation of SVP 10 in FIG. 6, blocks 61a-61d are not comprised of adjacent PE columns. In fact, the blocks are "virtual" in the sense that each block is defined by being associated with one of four data input lines. In other words, as explained below, input control unit 10a interleaves the blocks. As a result, each set of four adjacent PE's 20 contains a PE 20 from each block. Each such set of four PE's 20 is referred to herein as a PE sub-block. Because of the near-neighbor communication among PE's 20, PE 20(n) may access both PE 20(n+1) and PE 20(n−1), and thereby process adjacent samples as is required for most practical applications.

FIG. 7 is a block diagram of input control unit 54a configured for the interleaved SVP 10 of FIG. 6. The basic components of input control unit 54a are channel selector 71 and commutator 72.

Channel selector 71 selects one of four data channels 62a-62d for delivery of data samples to DIR 11. Each channel delivers an 8-bit sample, and the four samples thus delivered are referred to herein as a "set" of data samples. The DIR 11(i) columns of PE's 20(n modulo 4) are connected to a first channel 62a, the DIR 11(i) cells of PE's 20(n+1 modulo 4) are connected to a second channel 62b, etc.

Commutator 72 controls the write enable (WE) lines to each PE sub-block. Each commutator cell 72(1) is itself enabled by a clock signal (SWCK). For purposes of example, the working frequency of SVP 10, and thus the enable frequency of commutator cells 72(1) is 27 MHz. The number of commutator cells 72(1) is N/n, where N is the number processing elements and n is the number of channels 62a-62d.

FIGS. 6 and 7 are best understood with reference to FIG. 8, which is a timing diagram. Commutator cell 72(1) is activated to enable four words to be written into blocks 61a–61b. These four words are available from four input channels 62a–62d. One word is delivered to each PE 20 of a PE sub-block. When all four words are loaded to the PE subblock, the data is latched. Then, the process is repeated for the next commutator element 72(2) and the next four words. The result of the interleaving and the special configuration of input control unit 54a is that data is now read into SVP 10 at a rate of 108 MHz rather than 27 MHz.

Although the above description is applied to DIR 11, the same techniques are applicable to DOR 16. In other words, to increase the output frequency of SVP 10 by a factor of n, DOR 16 could be divided into n channels and output control circuit 54b configured to read out data at a desired rate and in the proper sequence.

Television Scan Rate Converter

Figure 9:
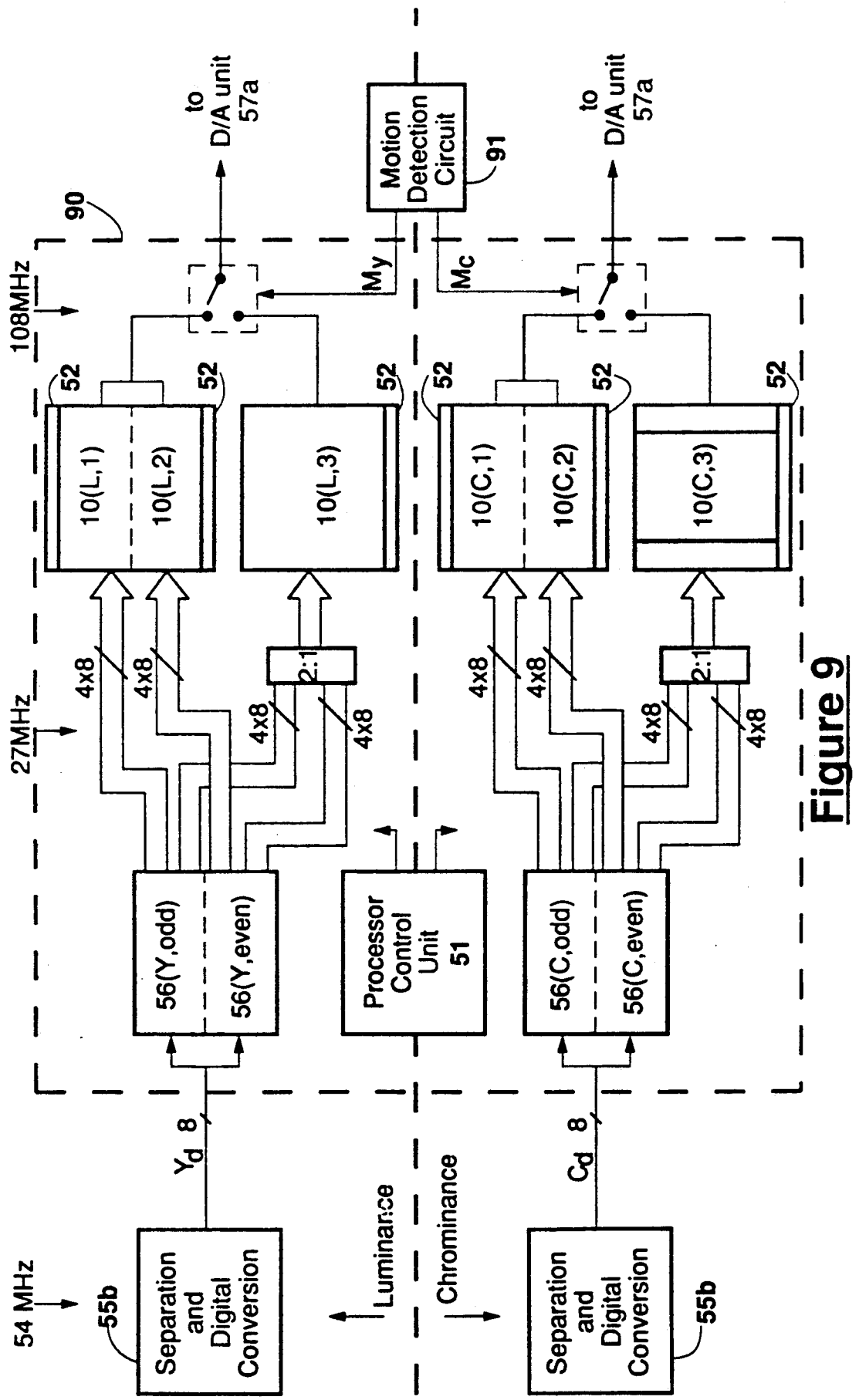
FIG. 9 is a block diagram of a digital processing unit for converting scan characteristics of an incoming television signal.

FIG. 9 illustrates an application of the input control unit 54a of FIGS. 6–8, a digital scan converter unit 90. Converter unit 90 is part of a television receiving system, such as shown in FIG. 5B. It converts an incoming television signal produced at one scan rate into a signal that results in a television picture at a different scan rate. The system of FIG. 9 may be interposed in the system of FIG. 5B, or may replace the SVP 10 of FIG. 5B, with appropriate inputs.

For purposes of example, the following description is in terms of converting a 1250-line interlaced 50 Hz scan rate signal into a 900 line interlaced 100 Hz scan rate signal. It should be understood, however, that scan converter 90 is not limited to these conversion values, and may be easily modified to accommodate conversion of other vertical resolution and scan rate values.

To achieve the 1250/2:1/50 Hz to 900/2:1/100 Hz conversion, two problems must be solved. First, the number of lines must be converted in the proper ratio. Second, if the frequency is different, the field rate must be converted. The conversion process must produce three lines for every four input lines and produce four fields for every two input fields.

The input to scan converter unit 90 is data words representing luminance and chrominance signals from an appropriate conversion and separation unit 55b. For purposes of example, it is assumed that the input rate to converter unit 90 is 54 MHz.

The Yd and Cd samples are loaded into field memory 56, with separate field memories, 56(Y) and 56(C), for luminance and chrominance signals. Furthermore, each field memory 56(Y) and 56 (C) has an odd field memory and an even field memory 56. For each type of signal, Yd and Cd, odd and even numbered samples are loaded to a corresponding odd or even field memory 56, which may be field memory 56(Y,odd), 56(Y,even), 56(C,odd), or 56(C,even).

An underlying assumption of scan converter 90 is that the scan rate cannot simply be doubled by doubling the rate at which data is read from field memory 56. This is a reasonable assumption in that, under current technology, the maximum speed of memory read and write operations is typically less than 33 MHz. Thus, the output rate of field memory 56 and the input rate of DIR are similarly limited.

Converter unit 90 solves the limitations of memory output rates by configuring each field memory 56 to provide n parallel outputs in one time interval. These outputs represent n data words, which are loaded in parallel to SVP 10. The loading is accomplished by configuring and controlling SVP 10 in accordance with the input control techniques described in the preceding section of this application.

Figure 10:
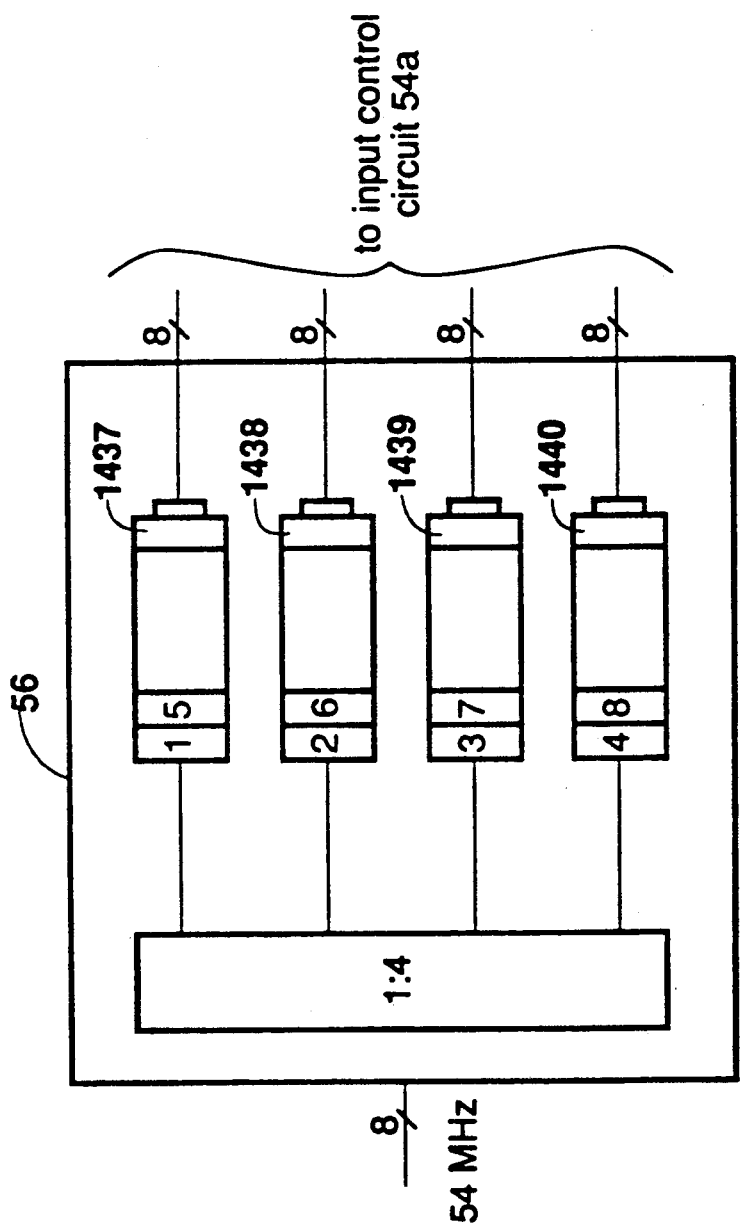
FIG. 10 illustrates one of the field memories of the digital processing unit of FIG. 9.

Referring now to FIG. 10, the division of a single field memory 56 into four parts for n channels of data is illustrated. The output frequency of field memory is the input frequency to input control unit 54a. In this example, because of the even/odd split of field memory 56, the output frequency is 27 MHz. Although FIG. 10 shows only one field memory 56, the other field memories 56 are configured in the same manner.

Because of the division of field memory 56 into n channels, the overall output frequency (OF) of field memory 56 is expressed as:

$$OF = n*CF$$

, where each CF is the frequency of each channel. The primary limitation is that CF be less than the maximum output rate, i.e., 33 MHz in this example. For example, if CF = 27 MHz, and there are four channels, OF = 108 MHz. This is twice the input frequency (IF) of 54 MHz, as is required for doubling the field rate.

By altering the number of channels or the read frequency of field memory 56, other OF values can be obtained. In fact, a simple formula can be used to determine the required number of channels and frequency per channel for a desired ratio of input field scan rate to output field scan rate:

$$Input\ rate/Output\ rate = (n*CF)/I/F.$$

As explained below, if the number of lines per field is also varied, a decimation or interpolation ratio will affect the effective output rate from SVP 10.

For altering the vertical resolution, SVP's 10 are used as vertical filters, in that they operate on current and previous lines from the same frame. Each SVP 10 receives the output of a field memory 56 and performs whatever filtering is desired. The filtering function is either decimation or interpolation, depending on whether the conversion is to a smaller or larger number of lines per frame.

In general, to implement the filter process, a filter function must be obtained, using the desired output characteristics. Each input data line represents a filter tap. The number of filter coefficients depends on the decimation ratio, and the coefficient values depend on a motion signal. For a five-tap filter, the general form of the filter function is:

$$y_n = L_n*x_0 + L_{n-1}*x_1 + L_{n-2}*x_2 + L_{n-3}*x_3 + L_{n-4}*x_4$$

, where $L_n$–$L_{n-4}$ represent five data lines and $x_0$–$x_4$ represent coefficient values.

Using the example of converting 1250 lines to 900 lines, the ratio of the actual lines used 2(576)/2(432) =4/3, because 2(576) represents the number of lines actually used in a 1250 line display. Thus, a decimation filter must implement a decimation ratio of 4:3. For every four input lines, SVP 10 must generate three output lines.

Figure 11A:
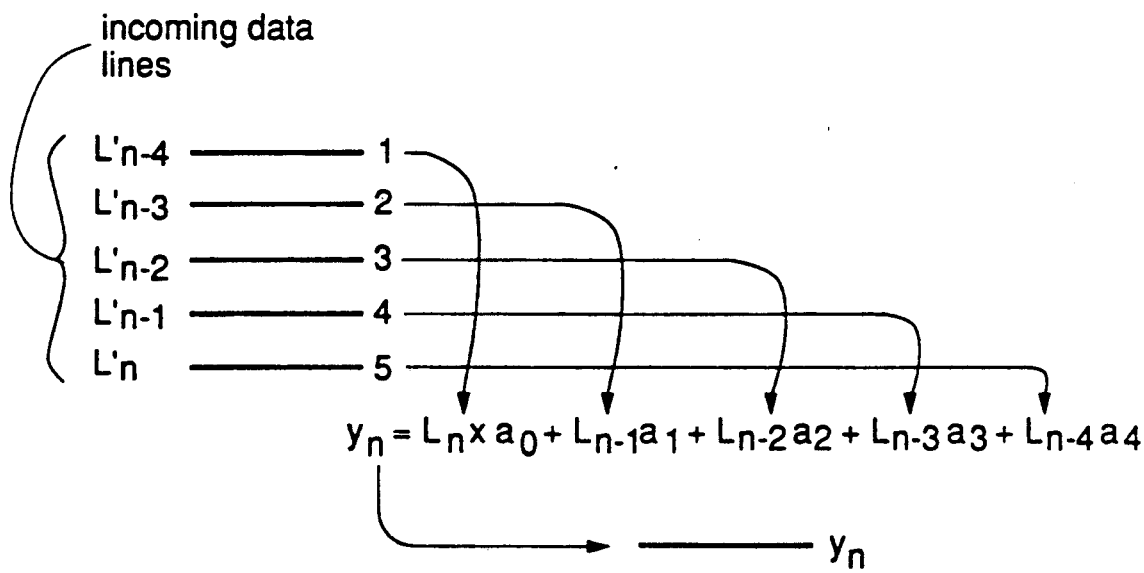
FIGS. 11A - 11B illustrate a vertical filtering process used for scan conversion.
Figure 11B:
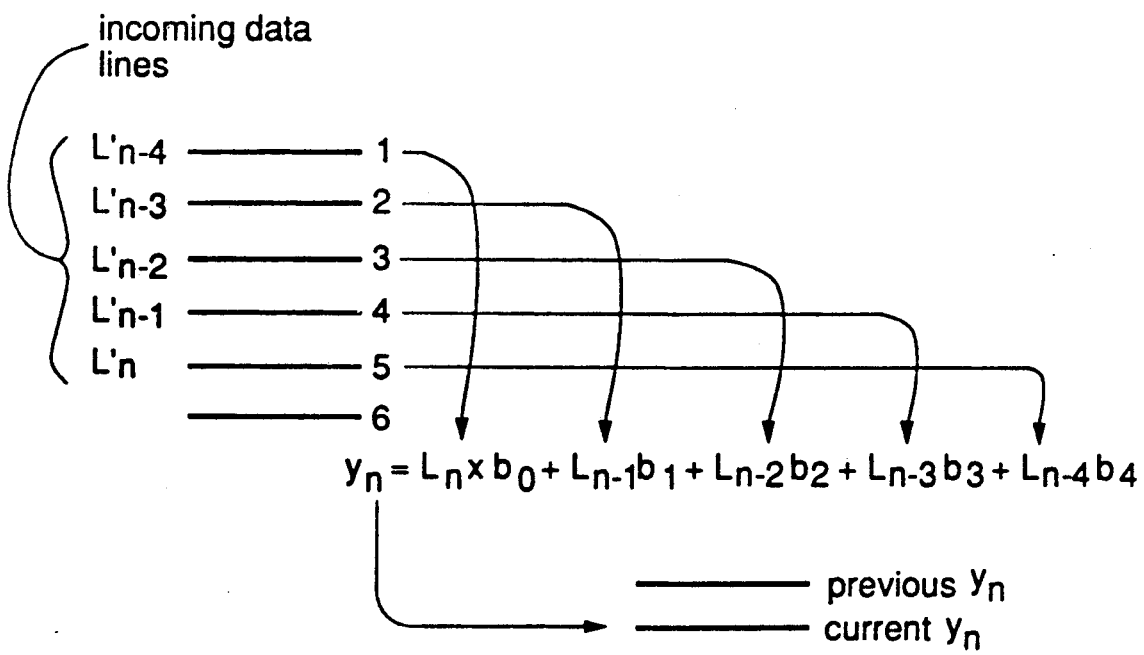

FIGS. 11A and 11B illustrate a vertical filtering process that accomplishes a 4:3 decimation. The filter is a five-tap filter, and thus uses five data lines. The filter function has 3 sets of coefficients, sets A, B, and C. The coefficient values for each set are $a_0$ – $a_4$, $b_0$ – $b_4$, and $c_0$ -c4, with values determined using digital filter design techniques.

In FIG. 11A, Lines $L'_n - L'_{n-4}$ are incoming lines, where $L'_n$ represents the line that is earliest in time. Lines $L_n - L_{n-4}$ represent the same five data lines from the processing point of view. From this point of view, the earliest incoming line, $L'_n$, is delayed five lines from the current input line, $L_n$. The data lines produce an output line, $y_n$.

In FIG. 11B, lines $L'_n - L'_{n-4}$ again represent incoming lines but a new input line takes the place of the fifth earlier data line. This is, in effect, a "rotation" in which the five most recent lines are always available for the filter process. For this step, the filter function uses the set B coefficients to produce the next $y_n$.

Figure 11C:
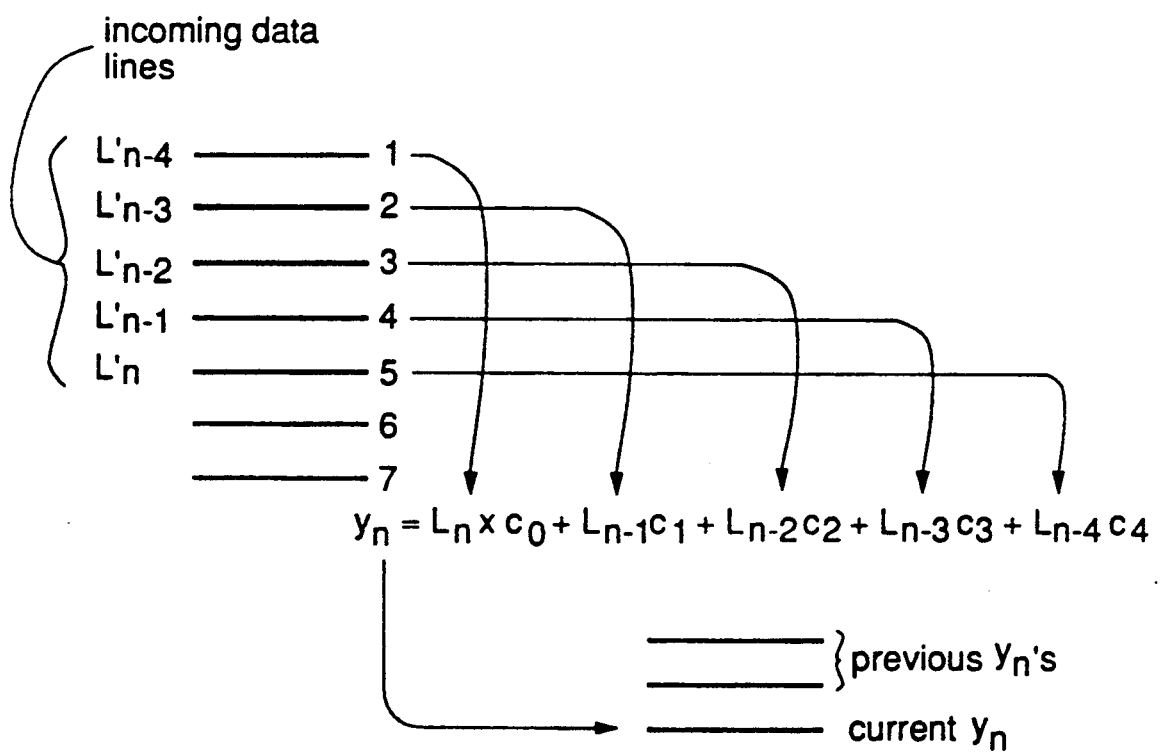

In FIG. 11C, the incoming data lines are again rotated so that the five lines most recent in time are available for the filter function. This step produces a third output line, $y_n$, using the set C coefficients. A fourth line would be generated with the same function, but using a fourth set of data lines and the coefficients of set A.

Figure 12:
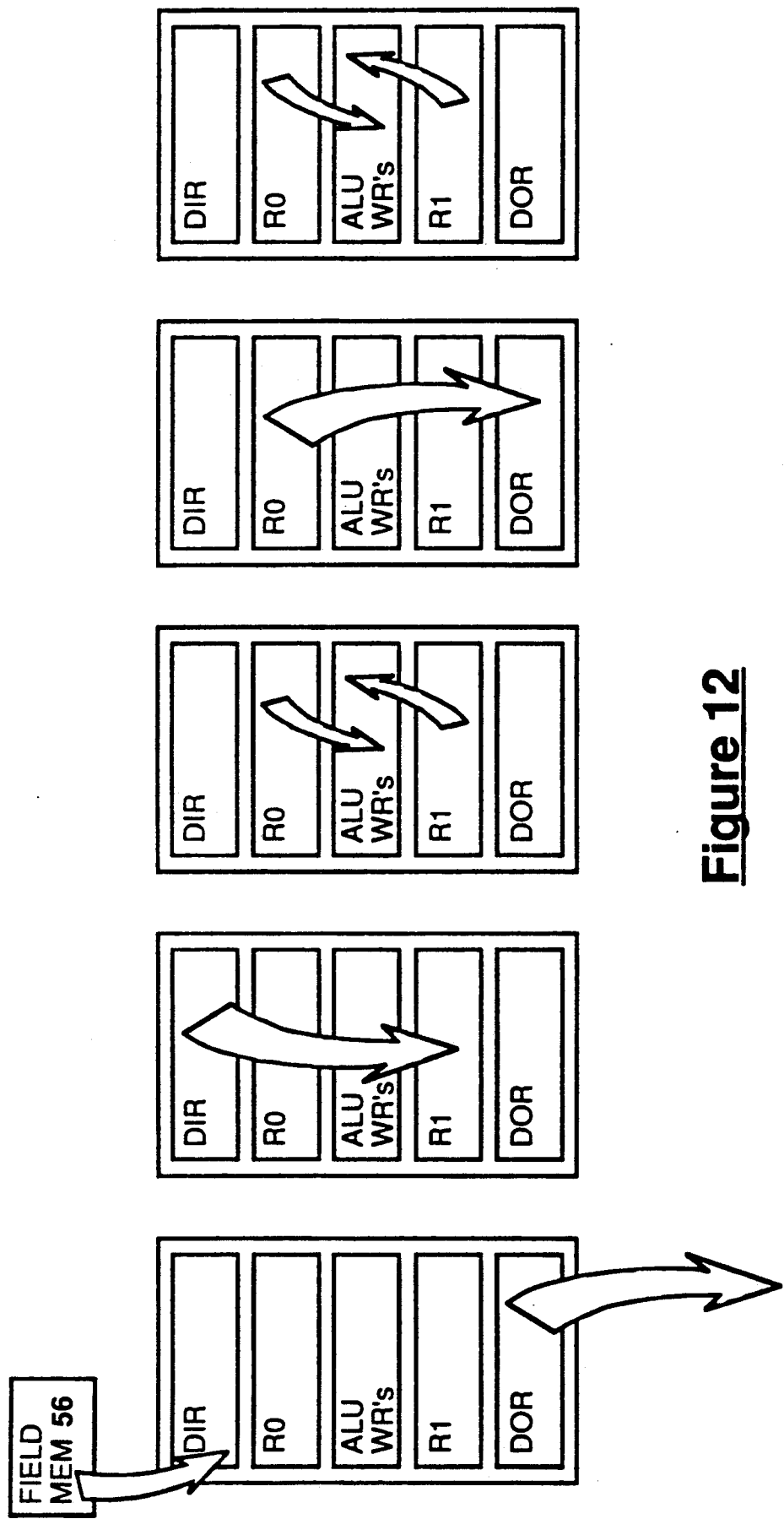
FIG. 12 illustrates the process of using a single-instruction multiple-data processor to implement a digital filter.

FIG. 12 illustrates the process of using SVP 10 for vertical filtering. During the first step SVP 10 receives data representing a horizontal line of an incoming television signal. If the scan rate is also being converted, the data is input in accordance with the scan conversion techniques described above, and the SVP 10 of FIG. 12 may be the same as any SVP 10 of FIG. 9. At the same time as the data is input to DIR a processed horizontal line is output from DOR 16.

In the second step, the contents of DIR 11 are transferred to R1. In the third step, previously stored lines from R0 12 and the new line from R1 are used for the filter computations, which are performed by ALU 14. For a five-tap filter, the number of previously stored lines used for the computations is four. In the fourth step, the processed line is transferred to DOR 16.

The final step uses a global rotation process, in which an individual line memory subset of R0 and R1 may be circularly rotated rather than shifted throughout the memory bank. This global rotation process is one of the advantages of using SVP 10, which eliminates the need for external line memories.

Figure 13:
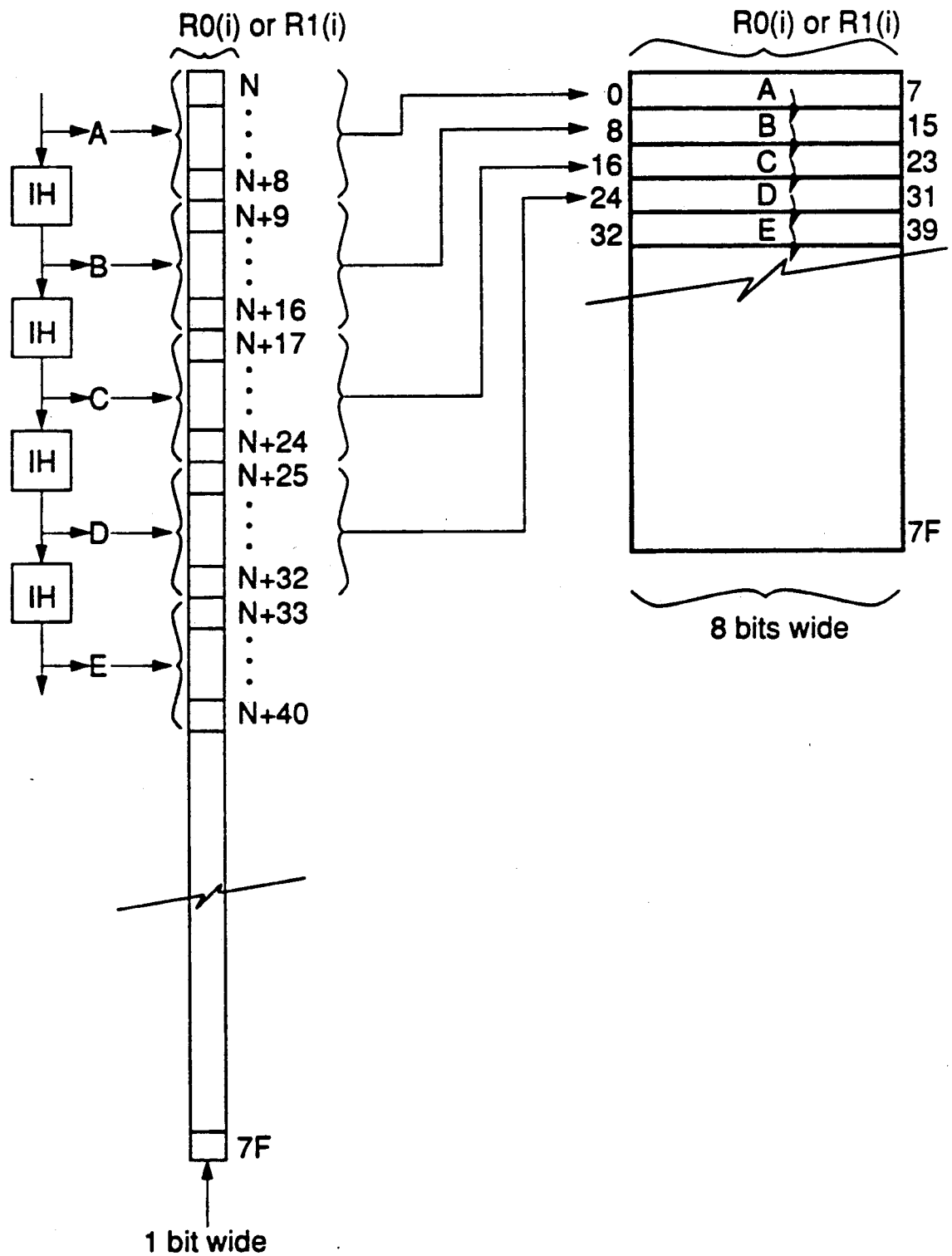
FIG. 13 illustrates the use of register files of a single-instruction multiple-data processor to provide a line memory rotation.

FIG. 13 illustrates the global rotation process. Five taps from an input signal represent input data samples to a single register file of a PE 20, which may be either R0 12 or R1 15. Each tap is delayed by one horizontal time period, thus the taps represent samples from corresponding sample positions of consecutive lines. Part of the 128 bit memory of R0 12 or R1 15 is allocated as global rotation memory space. For a five-tap filter in which each sample is 8 bits, a 40-bit space is used. This 40-bit space is configured so that each bit of a sample from one line position can be shifted to the corresponding bit positions of the next line's position. The line spaces are labeled as line space A - E.

During a global rotation, the first step is to shift each 8-bit sample to the next higher-addressed 8-bit line space. Then, new sample data is written to the first space, i.e., space A. The data that was in space E may be overwritten because it is no longer needed.

Referring again to FIG. 9, the decimation process is illustrated in the context of generating a picture from an incoming television signal. The luminance and chrominance signals are processed in the same manner at the same time. The following description is directed to luminance signal processing. During one separation and conversion of one input field, the previous odd field and even field, which are stored in filed memory 56(Y,odd) and 56(Y,even), are used by SVP 10(1), SVP 10(2), and SVP 10(3) to generate an output field.

Each SVP 10 performs the same filtering operation, but operates on different data and uses different filter coefficients. More specifically, SVP 10(1) and SVP 10(2) are used for still areas of the picture where there is no field-to-field motion to cause a blurring side effect of filtering. SVP 10(3) is used for areas of the picture in which there is motion.

A motion detection unit 91 is used to generate signals, My and Mc. When motion is detected, My or Mc, selects the appropriate output from SVP 10(1) and SVP 10(2) or from SVP 10(3). Various motion detection methods may be used for generating My and Mc.

For still areas of the picture, to generate one line of x, SVP 10(1) and SVP 10(2) each use five lines from field memories 56(Y,odd) and 56(Y,even). SVP 10(1) calculates odd lines as:

$$y_{odd} = L_{n,odd} \cdot a_0 + \ldots + L_{n-4,odd} \cdot a_4$$

SVP 10(2) calculates even lines as:

$$y_{even} = L_{n,even} \cdot a_0 + \ldots + L_{n-4,even} \cdot a_4$$

At the same time, SVP 10(3) calculates lines by using, alternatively, lines from field memory 56(Y,odd) and from field memory 56(Y,even). Thus, $$y_n = L_{n(odd/even)} \cdot alpha_0 + \ldots + L_{n(odd/even)} \cdot alpha_4$$

As stated above, whether a still output line or a motion output line is used, depends on the state of the motion detection signal. This process of generating each new line continues until the desired number of lines is generated. Using the 4:3 decimation example, the number of output lines is 432(2) = 864. The data for these lines is output from DOR 16 at a rate consistent with the scan rate conversion ratio. In example used herein, the output rate is 108(3/4) = 81 MHz.

Finite Impulse Response Filters

SVP 10 is useful for other filtering processes, not necessarily limited to television processing. In particular, there are many applications in which horizontal filtering among data samples of a single data packet is desirable. The following description is directed to using a single-instruction multiple-data processor, such as SVP 10, for a horizontal finite impulse response (FIR) filter process.

Figure 14:
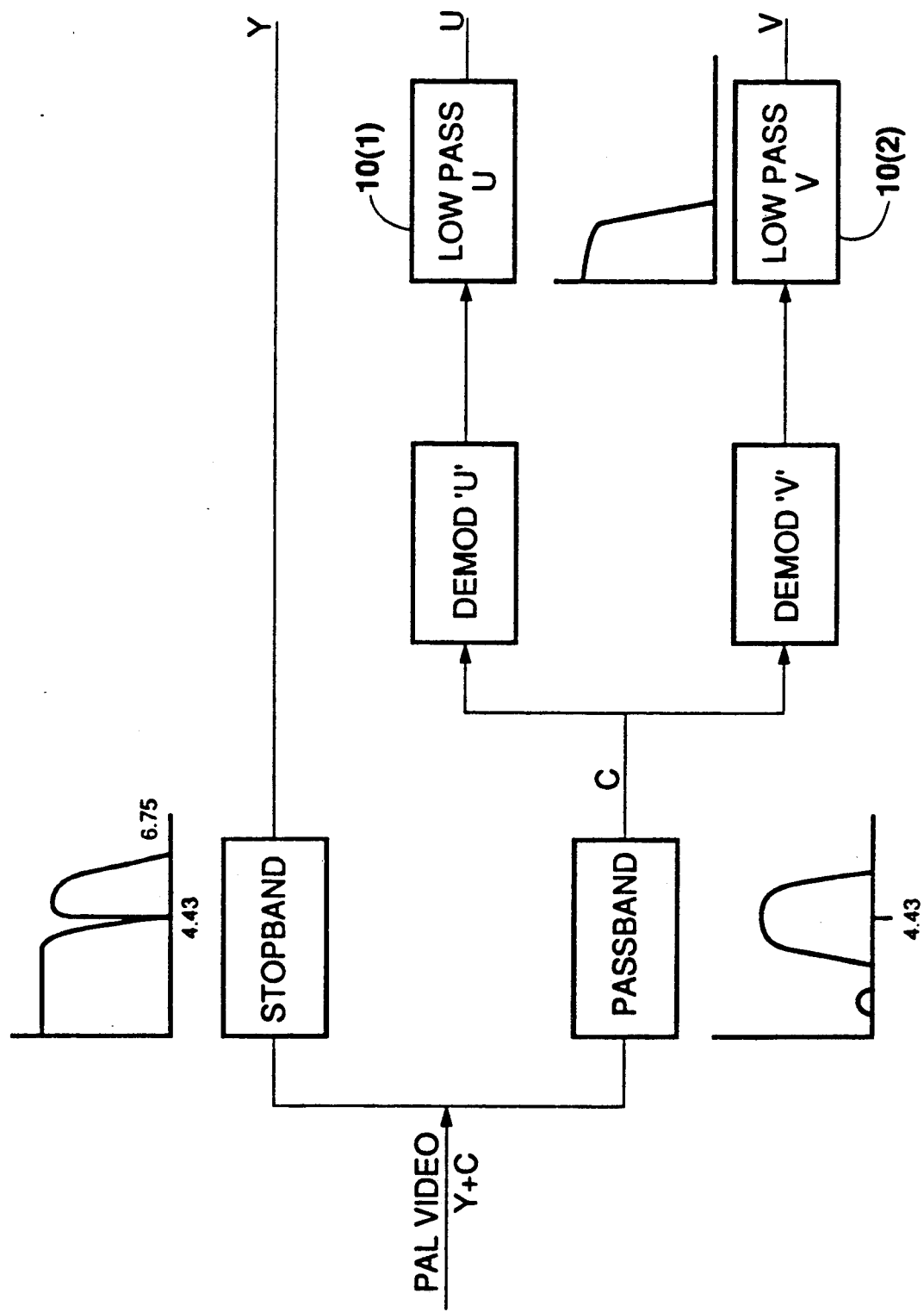
FIG. 14 illustrates a television demodulation process using a horizontal digital filter.

Although for purposes of example, a low pass filter is described, the same techniques may be used to implement any type of horizontal FIR filter. Also, for purposes of illustration, an example of filtering the chrominance signal of a PAL transmission is used. FIG. 14 illustrates the basic steps of the separation and demodulation process, including the low pass filtering step.

Figure 15:
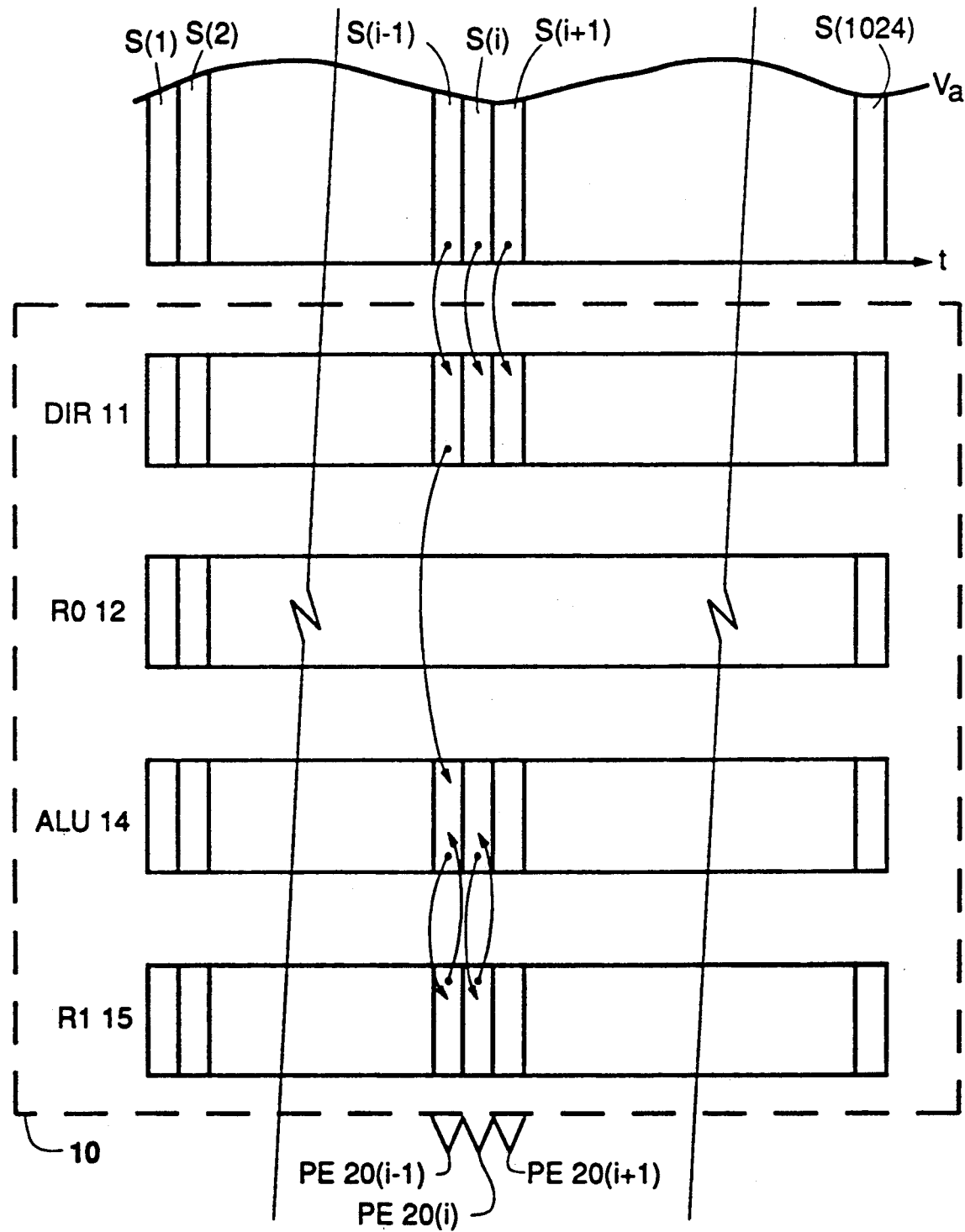
FIG. 15 illustrates the relationship between an incoming signal and processor elements of a single-instruction multiple-data processor used for horizontal digital filtering.

FIG. 15 illustrates SVP 10 in relation to one line of an input signal, Va. For purposes of example Va has 1024 samples, which are designated as S(i), i = 1...1024. SVP 10 has a corresponding number of PE's 20(i), i = 1...1024. FIG. 15 is merely representative of the process and does not purport to explicitly illustrate the various components of the receiving system front end, such as are illustrated in FIG. 5B, prior to input into SVP 10.

Va is received word-serially into DIR In this example, 1024 samples are loaded to DIR 11 during each 1H period. Transfers of sample values between the register files R0 12 and R1 15 and the operations of ALU achieve the sample delays and computations of the filter function. Data transfers from DIR 11 to memory R0 12 and R1 15 are via ALU 14, such as are explained in the above-cited patent applications, U.S. Ser. No. 435,864 and Ser. No. 421,499.

The general concept of using SVP 10 for horizontal filtering is to correspond filter taps to PE's 20. The terms of the filter function are realized by adding calculated values for each tap to memory in near-neighbor processors to the right. For each output sample, the desired value ends up in the appropriate PE 20.

Figure 16:
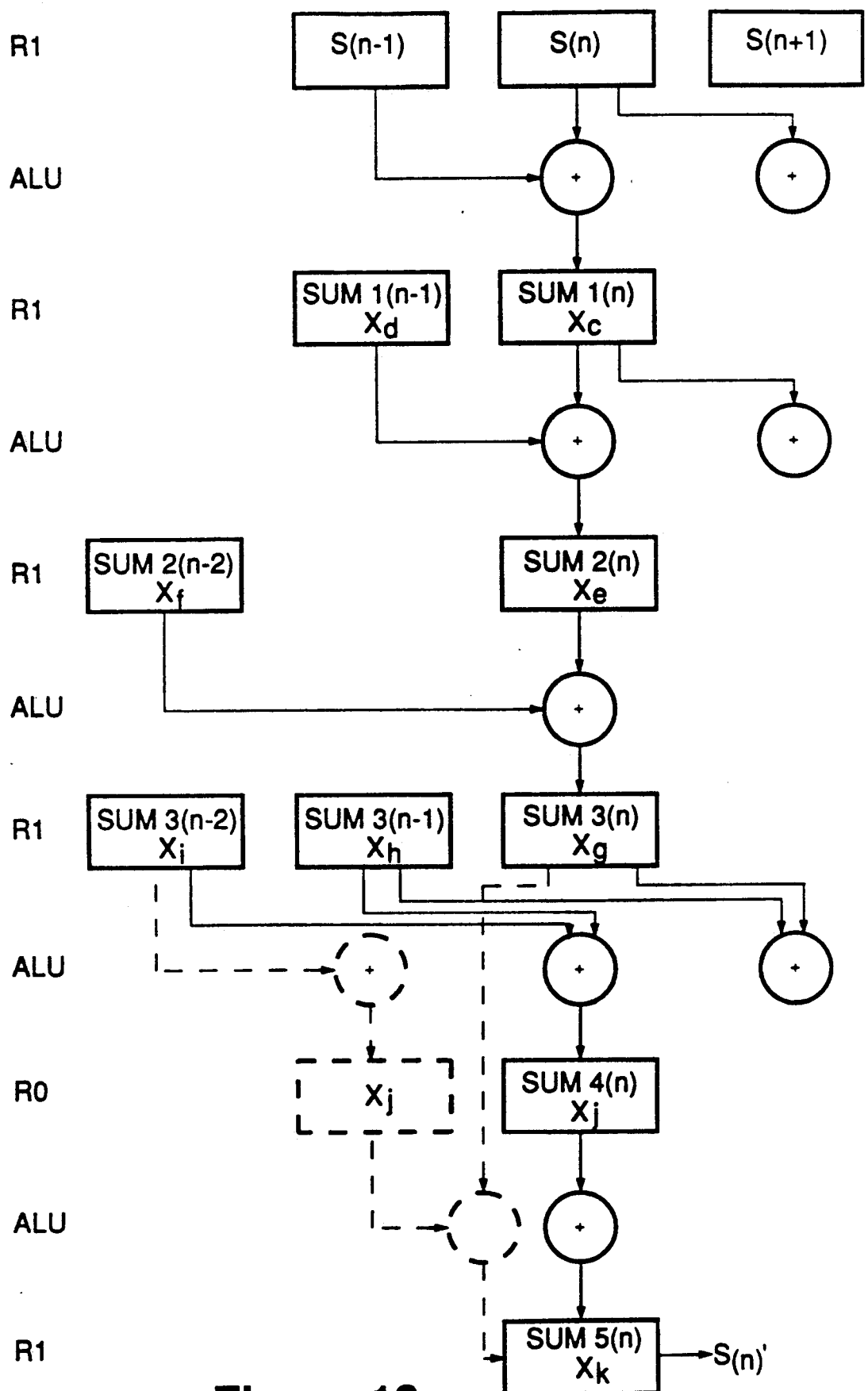
FIG. 16 illustrates a first method of using a singleinstruction multiple-data processor to implement a five-tap horizontal filter.

A first method of using SVP for horizontal filtering is illustrated in FIG. 16. An example of a desired filter function is:

$$H(z) = (1+z^{-1})^2(1+z^{-2})(1+z^{-1}+z^{-2})/24$$

, where the notation $z^{-n}$ represents a delay of n sample values. Many algorithms exist for calculating coefficient values to obtain a desired filter output response. The quotient, 24, ensures a unity gain and in terms of digital processing, is needed because each term of the function increases the number of bits. It is obtained by multiplying out the filter function, and recognizing that at zero frequency, the sum of the coefficients is 24.

FIG. 16 is a process diagram, illustrating the computational steps of the filter process. However, FIG. 16 represents computations of only a segment of SVP 10, specifically, PE 20(n-2),...20(n)...20(n+2), where (n-2), (n) and (n+1) identify PE's 20 that receive samples of line x having a corresponding sample number. The entire parallel computation for filtering an input sample, S(n), from line X to result in the output sample, S(n)'.

At the beginning of the computation for line X, S(1) through S(1024) are transferred in parallel from DIR 11 to the corresponding R1 12 for that PE 20. Thus, R1 15(n) of PE(n) contains S(n). The left neighbor PE(n-1) contains the preceding sample, i.e., S(n-1). The right neighbor PE(n+1) contains the next sample, i.e., S(n+1).

The computations to produce a single filtered sample value, begin by adding a first sample to its preceding sample. Thus, S(n) is added to S(n-1). The parallelization of the computation requires S(n-1) to be located in PE 20(n-1). The result of the addition is SUM 1(n). The next step is adding SUM 1(n) to SUM1(n-1) to obtain SUM 2(n).

Each of the above summing steps involves only a one-processor delay. To obtain the two-processor delay of the next term of the system function, SUM 2(n) is added to SUM 2(n-2) to obtain SUM 3(n).

To complete the process, there are two alternate methods. In the first method, SUM 3(n-2) is transferred into R0 12 (n1) and then added to SUM 3(n-1) in R0 to obtain SUM 4(n). Then SUM 4(n) is added to SUM 3(n) to obtain SUM 5(n). In the second method, which is shown in dotted lines in FIG. 16, SUM 3(n-2) is added to SUM 3(n-1) to obtain SUM 4(n-1). Then, SUM 4(n-1) is added to SUM 3(n) to obtain SUM 5(n).

SUM 5(n) is divided by some predetermined constant. In this example, the constant is 24, derived as explained above.

It should be understood that each PE 20 performs the filter function simultaneously. For example, in a five-tap filter function, the PE's 20(n) each process a tap and generate the result of the filter in parallel. Each PE 20(n) overlaps the next PE 20(n+1) by four taps. In other words, the filter's data is taken relative to each PE 20(n). Four of five sample values processed by each PE 20(n) overlap the sample values being processed by its neighbor PE 20(n+1).

The filter of FIG. 16 requires the filter function to be factored into the above-described form. Yet, not all filter operations can be factored in this manner. The same low pass filter as described above can be realized with the following function:

$$H(z) = (1+3z^{-1}+5z^{-2}+6z^{-3}+5z^{-4}+3z^{-5}+z^{-6})/24$$

This function was derived by factoring the previously described function into lower order terms. The L and 2L nearneighbor communications, as shown in FIG. 4, can be used to realize delays of one and two samples.

Figure 17:
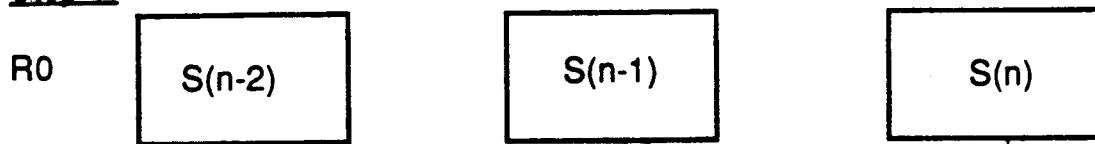
FIG. 17 illustrates a second method of using a singleinstruction multiple-data processor to implement a five-tap horizontal filter.
Figure 17:
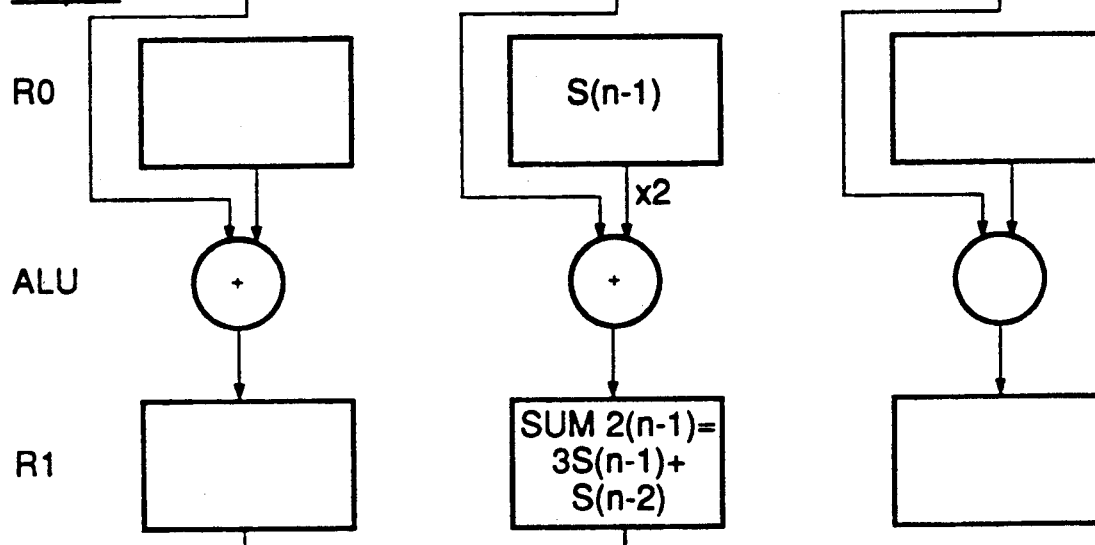
Figure 17:
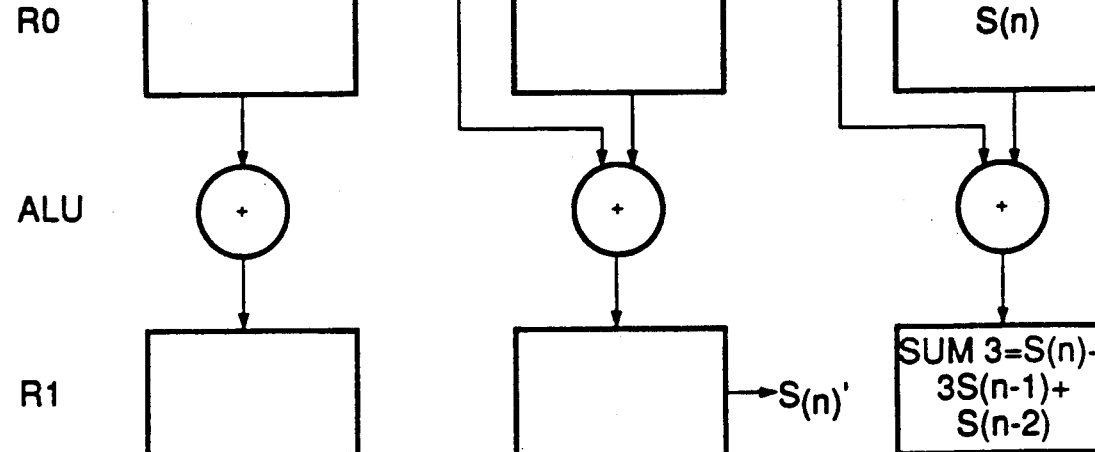

FIG. 17 illustrates the add-multiply calculations for this second five-tap filter:

$$y(n) = x(n) + 3x(n-1) + 5x(n-2) + 6x(n-3) + 5x(n-4) + 3x(n-5) + x(n-6)$$

, where $x(n)...x(n-6)$ represent data sample values delayed by 0...6 1H periods. Although only the calculations for PE's 20(9) and 20(10) are arbitrarily selected and shown, identical computations for all PE's 20(n) are performed simultaneously.

The above filter function may be efficiently realized in four stages, with the following four equations:

$$y1(n) = x(n) + x(n-1)$$
$$y2(n) = x(n) + x(n-1)$$
$$y3(n) = x(n) + x(n-2)$$
$$y4(n) = x(n) + x(n-1) + x(n-2)$$

These equations contain delays of no more than two samples. An operand that is delayed by two samples may be accessed via the 2L communication input of each PE 20(n), as shown in FIG. 4.

For PE 20(10), the first stage is:

$$x10b(n) = x10a(n) + x10a(n-1)$$

, and because of the inherent delay due to the data structure, $x10a(n-1)$ is the same as $x9a(n)$. Thus, $$x10b(n) = x10a(n) + x9a(n)$$

As indicated in FIG. 17, a value in R0 12(10) is added to the value stored in R0 12(9) of the left hand neighbor PE 20, and the values are summed into R1 15(10).

The second stage is the same as the first stage, so that:

$$x10c(n) = x10b(n) + x9b(n)$$

For this operation, both operands are from R1 15 because it holds the result of the previous operation.

The third stage is similar to the second stage except that bits are summed with the accumulator from the 2L neighbor. The equation is:

$$x10d(n) = x10c(n) + x8c(n)$$

This represents the two-sample delay of the third equation of the set of four equations.

The fourth stage requires an intermediate sum in R0 12 from operands in the 2L and L neighbors. This is added to the previously accumulated result in R1 15(10). The function implemented in stage four is:

$$x10e(n) = x8d(n) + x9d(n) + x10d(n)$$

This relates directly to the fourth equation.

To verify the above operations, the values may be substituted as:

$$y(10) = 7 + 3(6) + 5(5) + 6(4) + 5(3) + 3(2) + 1$$
$$= 96$$

, where $x(n), x(n-1), \ldots x(n-6)$ are the input values of PE 20(4) − PE 20(10).

As indicated by FIGS. 16 and 17, SVP 10 implements a multi-tap filter without the need to impose delays in other parallel signal paths. The center tap of the filter is assumed to be a reference point and is associated with the current data. PE's 20 to the right and left of the center PE 20 are associated with older and newer data respectively. For example, for a five-tap filter, reaching two PE's left and 2 PE's right makes up the five taps. No delay in the horizontal direction is incurred and the output is in phase with the reference input at the center of the filter.

Figure 18:
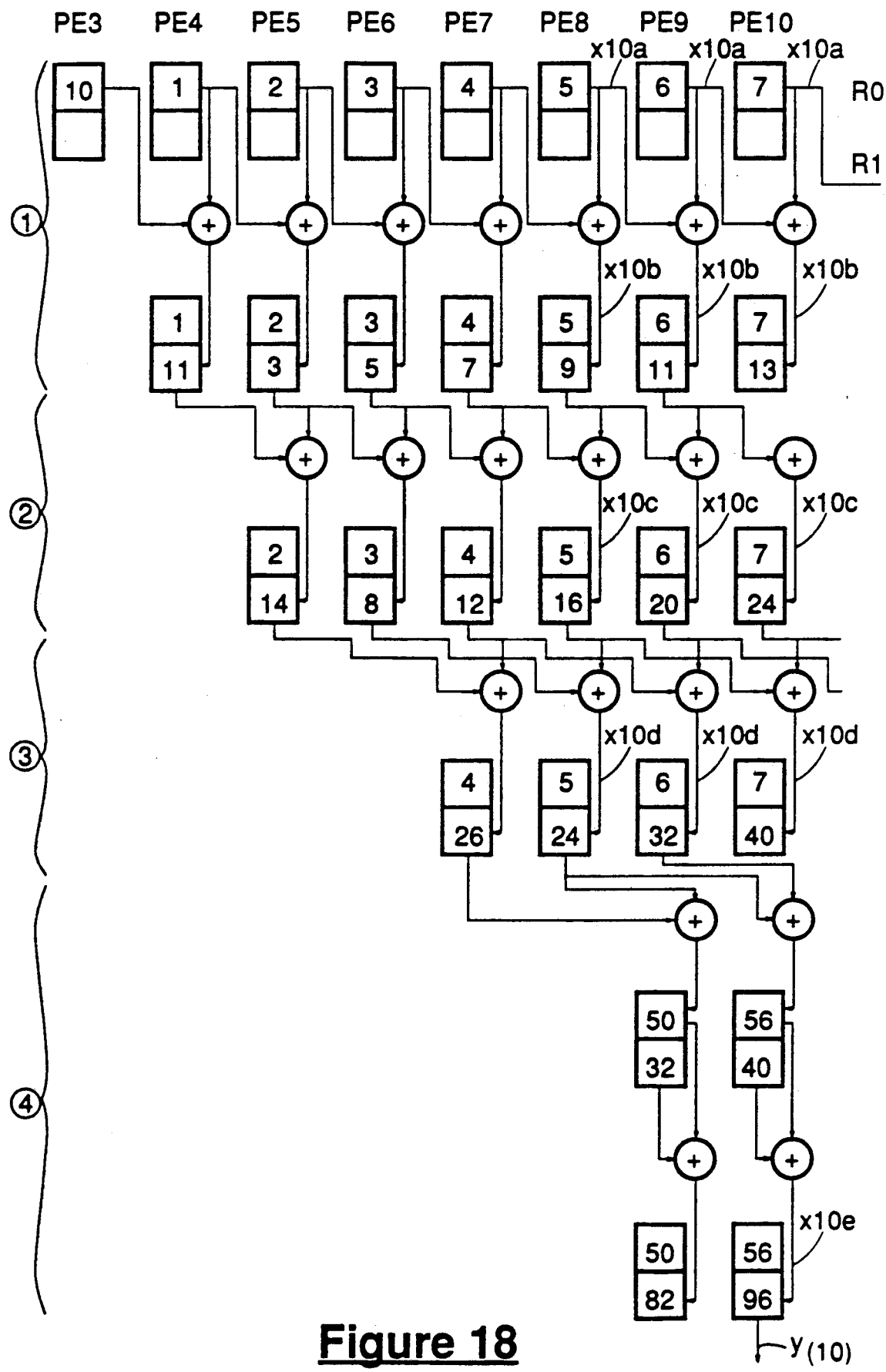
FIG. 18 illustrates a method of using a single-instruction multiple-data processor to implement a three-tap horizontal filter.

FIG. 18 illustrates another method of using a single-instruction multiple-data processor, such as SVP 10, to implement a horizontal FIR filter. For purposes of simplifying the explanation, an example having only three coefficients is assumed:

$$H(z) = 1\ 30\ 3z^{-1} + z^{-2}$$

This is a three-tap filter, and as indicated in FIG. 18, requires only a one-processor delay in each step. Thus, this method is referred to herein as the "one-processor delay method" as opposed to the "two-processor delay methods" of FIGS. 16 and 17.

As in the two-processor delay methods, SVP 10 is loaded with a line of sample values, $S(1)\ldots S(1024)$, with the 1024 length sample being used as an example only. FIG. 18 shows the calculations only with respect to three PE's 20, i.e., PE 20(n−2), PE 20(n−1), and PE 20(n). The registers R0 12 and R1 15 are used as accumulators to hold temporary results.

First, $S(n-2)$ and $S(n-1)$ are added to obtain SUM $1(n-1)$. Then, this sum is added to twice the value of $S(n-1)$. The result is SUM $2(n-1)$. Finally, SUM $2(n-1)$ is added to $S(n)$ to obtain SUM $3(n)$. As desired, SUM $3(n)$ ends up in the accumulator of PE 20(n).

The same process can be easily extended to other filters, requiring fewer or more taps. For real-time applications, the primary limitation as to length is processing time. For example, to achieve real-time television processing, the algorithm should take no longer than the horizontal period for a line, i.e., 1H. A particular advantage of the filter described herein is that processing unit 50a may be used so that programs can be developed on a host system and downloaded to control unit 51 and instruction generator 52.

Other Embodiments

Although the invention has been described with reference to specific embodiments, this description is not meant to be construed in a limiting sense. Various modifications of the disclosed embodiments, as well as alternative embodiments of the invention will be apparent to persons skilled in the art. It is, therefore, contemplated that the appended claims will cover all modifications that fall within the true scope of the invention.

What is claimed is:

1. A digital processing system, used in a television receiver, for converting an incoming television signal having certain scan characteristics to a display signal having different scan characteristics, comprising:

a pair of luminance field memories, one for odd fields and one for even fields, for storing data samples of said incoming signal;

a pair of chrominance field memories, one for odd fields and one for even fields, for storing data samples of said incoming signal;

a pair of luminance single-instruction multiple-data processors for implementing a vertical filter process for changing the number of lines per field of said incoming signal, wherein one of said processors is in communication with said luminance field memory containing odd fields and operates on samples of said odd fields and wherein another one of said processors is in communication with said luminance field memory containing even fields and operates on samples of said even fields;

a pair of chrominance single-instruction multiple-data processors for implementing a vertical filter process for changing the number of lines per field of said incoming signal, wherein one of said processors is in communication with said chrominance field memory containing odd fields and operates on samples of said odd fields and wherein another one of said processors is in communication with said chrominance field memory containing even fields and operates on samples of said even fields;

an instruction generator associated with each of said processors for providing instructions to said processors; and a processor control unit for providing control and timing signals to said processors.

2. The processing system of claim 1, and further comprising a luminance motion processor and a chrominance motion processor for implementing a filter function that changes the number of lines per field when said incoming signal indicates motion in the transmitted television picture.

3. The processing system of claim 2, and further comprising a switch for controlling the output of said processors, depending on an incoming motion detection signal.

4. The processing system of claim 1, wherein each of said field memories are comprised of a number of channels, said number of channels being determined by a preselected ratio of input data rate to output data rate, and further comprising an input control circuit associated with each of said processors for accepting parallel input from said channels.

5. The processing system of claim 4, wherein said input control circuit is comprised of a data selector circuit for directing data to virtual blocks of each of said processors and commutator cells for writing data in each block to adjacent processing elements of said processors.

6. A television receiving system for receiving an incoming video signal and converting its scan characteristics, comprising:

color separation and analog to digital units for converting said incoming signal to data samples representing a digitized luminance signal and a digitized chrominance signal;

a pair of luminance field memories, one for odd fields and one for even fields, for storing data samples of said incoming signal;

a pair of chrominance field memories, one for odd fields and one for even fields, for storing data samples of said incoming signal;

a pair of luminance single-instruction multiple-data processors for implementing a vertical filter process for changing the number of lines per field of said incoming signal, wherein one of said processors is in communication with said luminance field memory containing odd fields and operates on samples of said odd fields and wherein another one of said processors is in communication with said luminance field memory containing even fields and operates on samples of said even fields;

a pair of chrominance single-instruction multiple-data processors for implementing a vertical filter process for changing the number of lines per field of said incoming signal, wherein one of said processors is in communication with said chrominance field memory containing odd fields and operates on samples of said odd fields and wherein another one of said processors is in communication with said chrominance field memory containing even fields and operates on samples of said even fields;

an instruction generator associated with each of said processors for providing instructions to said processors; and a processor control unit for providing control and timing signals to said processors;

a digital to analog unit for converting said data samples to an analog signal for display;

a display unit in communication with said digital to analog unit for generating a picture signal for display; and a display for displaying said picture.

7. The television receiving system of claim 6, and further comprising a luminance motion processor and a chrominance motion processor for implementing a filter function that changes the number of lines per field when said incoming signal indicates motion in the transmitted television picture.

8. The television receiving system of claim 7, and further comprising a switch for controlling the output of said processors, depending on an incoming motion detection signal.

9. The television receiving system of claim 6, wherein each of said field memories are comprised of a number of channels, said number of channels being determined by a preselected ratio of input data rate to output data rate, and further comprising an input control circuit associated with each of said processors for accepting parallel input from said channels.

10. The television receiving system of claim 9, wherein said input control circuit is comprised of a data selector circuit for directing data to virtual blocks of each of said processors and commutator cells for writing data in each block to adjacent processing elements of said processors.

11. A method of using a single-instruction multiple data processor to convert an incoming television signal having certain scanning characteristics to a display signal having different scanning characteristics, comprising the steps of:

storing data samples representing said incoming signal in memory, said memory separate from said processor;

reading a set of said data samples in sequential order from said memory in a single time interval, wherein the number, n, of said data samples in said set is determined by a preselected data input rate to said processor;

loading said n data samples to an input register of said processor during said time interval, wherein said input register is controlled so that said sequential order is maintained;

communicating said data samples to a computational layer of said processor, while retaining said sequential order;

and processing said data samples, using said processor.

12. The method of claim 11, wherein said processing step includes changing the number of lines per field of said incoming signal using a vertical filter function.

13. The method of claim 12, wherein said filter function is implemented with said single-instruction multiple data processor, using local memories of processing elements to store incoming data line-by-line.

14. The method of claim 13 and further comprising the step of using a global rotation process to supply said processing elements with incoming data.

15. The method of claim 12, and further comprising the step of determining whether there is motion in said incoming data and determining said filter function accordingly.

* * * * *